(12) United States Patent
Joisten et al.

(10) Patent No.: US 9,304,336 B2
(45) Date of Patent: Apr. 5, 2016

(54) MAGNETO-OPTIC ASSEMBLY

(71) Applicants: Commissariat a l'Energie Atomique et aux Energies Alternatives, Paris (FR); Centre National de la Recherche Scientifique (CNRS), Paris (FR)

(72) Inventors: Helene Joisten, Grenoble (FR); Bernard Dieny, Villard de Lans (FR); Philippe Sabon, Moirans (FR); Roberto Calemczuk, Grenoble (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 248 days.

(21) Appl. No.: 14/053,090

(22) Filed: Oct. 14, 2013

(65) Prior Publication Data

US 2014/0103919 A1    Apr. 17, 2014

(30) Foreign Application Priority Data

Oct. 15, 2012    (FR) .................................. 12 59791

(51) Int. Cl.
G01R 33/032    (2006.01)
G02F 1/09    (2006.01)
G01R 33/10    (2006.01)

(52) U.S. Cl.
CPC ................ *G02F 1/09* (2013.01); *G01R 33/032* (2013.01); *G01R 33/10* (2013.01)

(58) Field of Classification Search
CPC ....................................................... G01R 33/032
USPC ........................................................ 324/244.1
See application file for complete search history.

(56) References Cited

U.S. PATENT DOCUMENTS

2004/0239936 A1    12/2004    Kochergin

FOREIGN PATENT DOCUMENTS

FR    2 958 791    10/2011

OTHER PUBLICATIONS

Search Report and Written Opinion as issued for French Patent Application No. 1 259 791, dated Jun. 25, 2013.
Barman, A., et al., "Benchtop time-resolved magneto-optical Kerr magnetometer," Review of Scientific Instruments, vol. 79, 2008, pp. 1-5.
Siblini, A., et al., "An AC magnetic field remote sensor using a ferrofluid material: application to the measurement of off-centring sleeves of HV transmission lines," Meas. Sci. Technol., vol. 3, 1992, pp. 1068-1071.

*Primary Examiner* — Bot Ledynh
(74) *Attorney, Agent, or Firm* — Pillsbury Winthrop Shaw Pittman LLP

(57) ABSTRACT

A magneto-optic surface includes a support; at least two moving elements; each of the moving elements including at least one anchoring point to the support and at least one moving part movable with respect to the support, the moving part including at least one magnetic part; the support and the moving elements being laid out in such a way that under the effect of an external magnetic field, at least one of the moving elements moves with respect to the support such that the optical properties of the magneto-optic surface are modified.

15 Claims, 17 Drawing Sheets

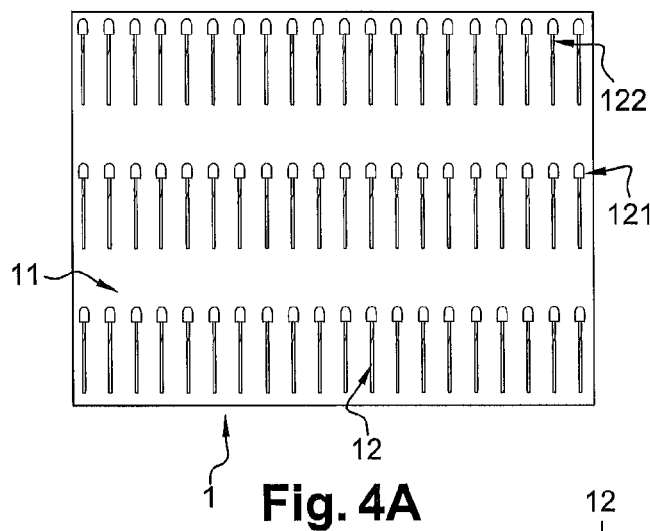
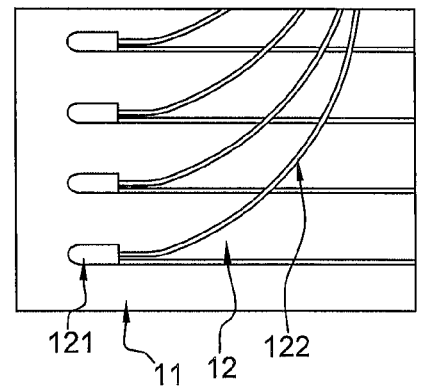
Fig. 4A  Fig. 4B
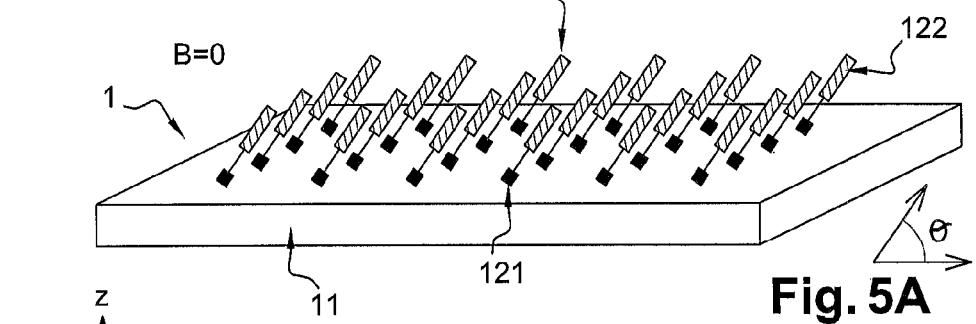
Fig. 5A
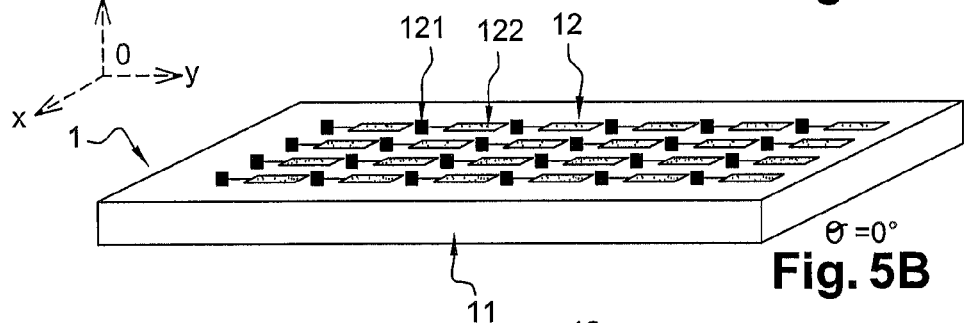
Fig. 5B
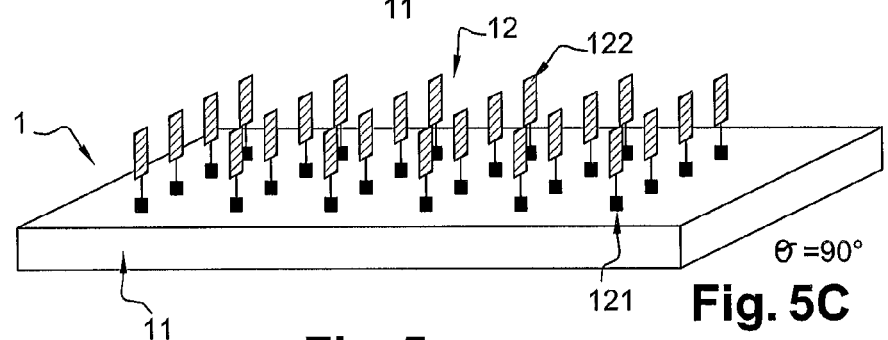
Fig. 5C
Fig. 5

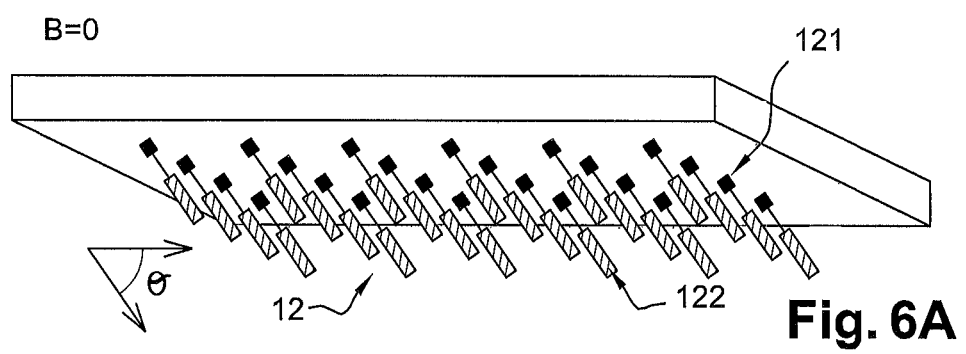
Fig. 6A
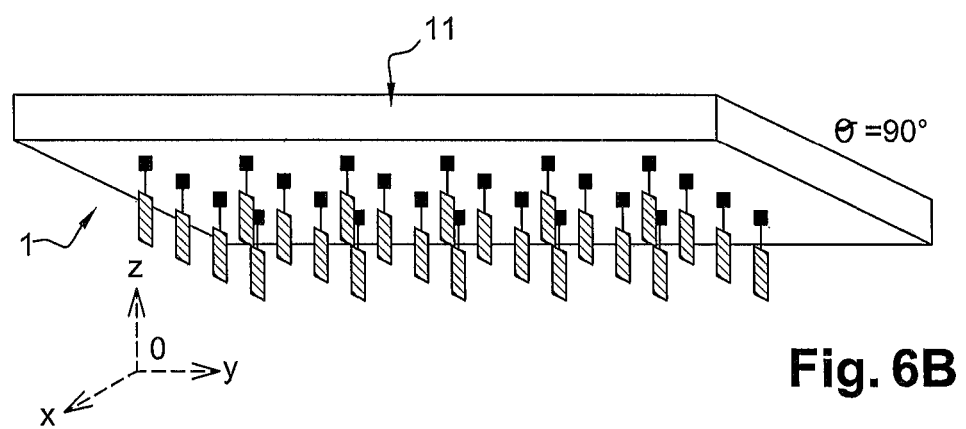
Fig. 6B
Fig. 6

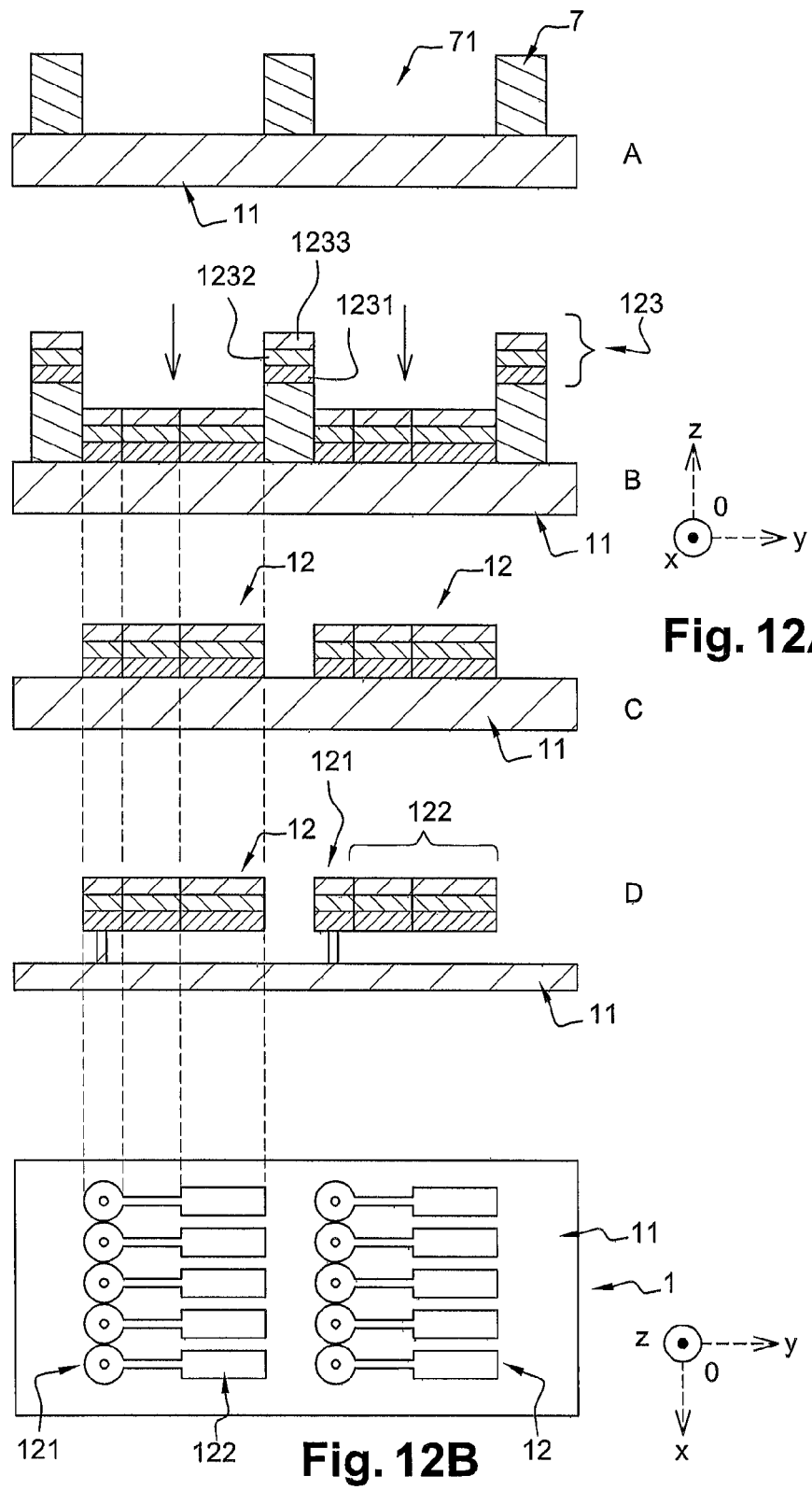

MAGNETO-OPTIC ASSEMBLY

CROSS REFERENCE TO RELATED APPLICATIONS

This application claims the benefit of priority from French Patent Application No. 1259791 filed on Oct. 15, 2012, the entire content of which is incorporated herein by reference.

FIELD

The invention relates to a magneto-optic surface and also to a method of manufacturing such a magneto-optic surface, as well the use of such a magneto-optic surface.

BACKGROUND

In the field of magnetic field mapping or imaging, different methods exist making it possible to characterise or visualise magnetic fields.

A first known method of characterisation of magnetic materials, making it possible to visualise the magnetic domains of the magnetic materials, is based on Kerr or Faraday magneto-optic effects. Such a type of characterisation of magnetic materials is described in the following document D1: Anjan Barman, T. Kimura, Y. Otani, Y. Fukuma, K. Akahane et al., "*Benchtop time-resolved magneto-optical Kerr magnetometer*", Rev. Sci. Instrum. 79, 123905 (2008). The Kerr effect consists in studying the modifications in reflection of light polarised by a magnetic material and the Faraday effect consists in studying the modifications in transmission of light polarised by a magnetic material. The contrast of the imaging is linked to the orientation of the magnetisation in the material. These two effects can also enable, in certain experiments, the visualisation of external magnetic fields, which act on the magnetisation of the sample. They can in this way give a form of image of the ambient magnetic field. But these effects are indirect and require the lighting of the magnetic sample by polarised light, the images of the magnetic domains being visualised by measuring the rotation of the polarisation of light, translating the orientation of the magnetisation. The study of magnetic fields by these methods requires a costly and cumbersome optical assembly with analyser and polariser.

Another known method also making it possible to optically visualise information on the intensity and the direction of magnetic fields applied in space is the use of ferrofluid materials as described in the following document D2: A Siblini, J Monin, G Noyel and O Brevet-Philibert, "*An AC magnetic field remote sensor using a ferrofluid material: application to the measurement of off-centring sleeves of HV transmission lines*", Meas. Sci. Technol. 3 1068 (1992). In this document, magnetic particles dispersed in colloidal solution in a fluid are used. The magnetic field is visualised by the masses of magnetic particles, which move, group together, and agglomerate towards zones of higher gradients of magnetic fields and stronger fields. It is their distributions and concentrations in space that provide information on the magnetic field to observe and form a mapping of the field lines. This method has the drawback of requiring the not very practical use of ferrofluid or powder materials, not reusable because often non-reversible. In addition, these materials generally have a low magnetic susceptibility.

SUMMARY

Optical properties of the surface within the scope of embodiments of the present application are taken to mean the properties in reflection, in transmission or in emission of the surface.

An aspect of the invention aims to overcome all or part of the drawbacks of the prior art identified above, and particularly to propose alternative not very costly and not very cumbersome means making it possible to map a magnetic field.

To this end, an aspect of the invention relates to a magneto-optic surface comprising:
 a support;
 at least two moving elements;
each of the moving elements comprising:
 at least one anchoring point to the support;
 at least one moving part with respect to the support, the moving part comprising at least one magnetic part;
the support and the moving elements being laid out in such a way that under the effect of an external magnetic field, at least one of the moving elements moves with respect to the support such that the optical properties of the magneto-optic surface are modified.

This has the benefit of making it possible to detect an external magnetic field, to visualise its nature, its variations and/or to map it, in the form of an image. The contrasts or colours of the image depend on the characteristics—intensity and direction—of the magnetic field at any point of the image. In fact, under the effect of the external magnetic field, the magnetic part of the moving elements, comprised in the moving part of these moving elements, is going to orient itself along the external magnetic field which leads to a movement, with respect to the support, of the moving elements, and more particularly of the moving part of the moving elements. The external magnetic field can cause locally the distortion, the movement, the reorientation of each moving element individually. These moving elements can be actuated remotely by one (or more) external magnetic field, by reacting to the couples and to magneto-mechanical forces created by the external magnetic field and/or by its gradient. The movement of at least one moving element with respect to the support is reflected visually by a modification of the optical properties of the surface. The individual movements of the moving elements have an overall effect on the surface. The modified optical properties of the surface, illuminated by an external light source (natural or artificial light), are the properties in reflection, in transmission or in emission of light. These modifications are visible by a receiver, which is either the naked eye, or a microscope or instead an artificial vision device, for example an optical detector capturing the image of the magneto-optic surface. Each moving element can react differently if the magnetic field is not uniform in space, or evolves over time, and reacts differently from its neighbour. The observation and/or the analysis of the modifications of the image of the magneto-optic surface between an initial state, corresponding to a first equilibrium position of the moving elements, and an intermediate state, corresponding to a second equilibrium position of the moving elements, make it possible to visualise and/or map an external magnetic field to which is subjected the magneto-optic surface and to which are sensitive the magnetic parts of the moving parts of the moving elements. The notion of layout of the support and of the moving elements encompasses their positioning with respect to each other, but also the materials from which they are constituted. The moving part of the moving elements is free to remain floating or under stress or rests on the support or can hang in the case where the surface is turned over. In the case where the surface is of macroscopic dimension, the microscopic phenomenon becomes visible in the image of the surface, by its modified optical properties. The moving elements may not be individually discernible to the naked eye or to the microscope, due to their small micro/or nanometric dimensions. But although invisible on the surface of the substrate, the moving elements create visible information, characteristic of the magnetic field applied that actuates them. They reflect, transmit or emit light differently depending on their orientations. In an analogous manner to the pixels of digital imaging, each elementary surface containing a single moving element represents the smallest contribution to the visualisation of the magnetic field. This smaller surface dimension makes it possible to give the limit of spatial resolution of the visualisation of the magnetic field. The definition and the resolution of the image of the applied magnetic field (number of points composing it, or number of pixels per surface unit), depends on the population density of the moving elements on the surface of the object, on their dimension, on the step that separates them, and on the ratio of these dimensions to the size of surface observed.

Apart from the main characteristics that have been disclosed in the preceding paragraph, the magneto-optic surface according to an embodiment of the invention may have one or more complementary characteristics among the following, considered individually or according to technically possible combinations thereof:

the support is transparent to the light emitted by an external light source and the optical properties of the modified magneto-optic surface are properties in transmission of the light. Thus, for example, by positioning the support in such a way as to make the moving elements hang, the moving elements are visible by transparency in transmission of the light emitted by the external light source;

the support is opaque to the light emitted by an external light source and the optical properties of the modified magneto-optic surface are properties in reflection of the light. The properties in reflection of the surface are observable by looking at the face on which are anchored the moving elements from above. The support can thus seem to become transparent to light, observed in reflection. In fact, an object placed below the opaque support is invisible. But if this object is a magnetic field source, for example a magnet, it becomes visible by looking at the surface of the substrate from above;

the moving part with respect to the support of each of the moving elements comprises a light emission device or light emitter. In this case, it is the light emission properties of the surface that are modified under the action of an external magnetic field. The light emission device may be a light emitting diode (LED), an organic light emitting diode (OLED), a laser diode, etc. The direction of the light emitted depends on the external magnetic field in which the magneto-optic surface is immersed;

the support comprises an electrical power source and in the light emission device of each of the moving elements is connected to the electrical power source by a connection element. The light emission device of the moving part may be connected, by the connection element, to the electrical power source of the support in passing through the anchoring point to the support of the moving element. The connection element may also be an electrically conducting part of the moving element formed by using a material of copper (Cu), aluminium (Al), chromium (Cr), alloy nickel-iron (NiFe) type, etc.;

the moving part of each of the moving elements comprises a flexible part. The presence of a flexible part makes it possible to improve the efficiency of the device by facilitating the movement of the moving part under the effect of an external magnetic field. The more flexible the moving part, the more the moving element is sensitive to weak external magnetic fields. The flexibility depends on the compositions, materials used, their mechanical properties, particularly their Young's moduli, geometries, dimensions, aspect ratios, links to the surface, as well as internal stresses present in the materials used;

the moving part of each of the moving elements comprises a plurality of flexible parts connected to each other by less flexible parts. This configuration makes it possible to improve the flexibility of the moving part of the moving element and thus the efficiency of the magneto-optic surface thanks to the addition of degrees of freedom to the moving part of the moving element;

the moving part of each of the moving elements comprises a reflecting part. This makes it possible to improve the efficiency of the magneto-optic surface. The more the reflecting part of the moving part occupies an important proportion of the surface, the more the efficiency of the magneto-optic surface is improved. By improving the reflecting properties of the moving part, in particular its reflectivity, the detection of modifications of the optical properties of the surface is easier.

the anchoring point to the support is a fixed axis and the moving element is rotatable around the fixed axis under the effect of the external magnetic field.

the moving elements are laid out such that they move along a same vector under the effect of a homogeneous external magnetic field. Thus, the moving elements, under the effect of a homogeneous external magnetic field move in the same manner with respect to the support of the magneto-optic surface: the movement vectors of each of the moving elements have same sense, same direction and same norm. Thus, in this configuration, the moving elements of the two sub-assemblies have an identical behaviour when they are subjected to the same magnetic field. The reflectivity is modified, the phenomenon is more marked for a favoured observation direction of the plate.

the magneto-optic surface comprises a first sub-assembly comprising at least two moving elements, the moving elements of the first sub-assembly moving along a same first vector under the effect of a homogeneous external magnetic field; and a second sub-assembly comprising at least two moving elements, the moving elements of the second sub-assembly moving along a same second vector under the effect of a homogeneous external magnetic field.

An aspect of the invention also relates to a method of manufacturing a magneto-optic surface according to one of the previously described embodiments, the method comprising:

a step of depositing on the support a layer of sacrificial material;

a step of forming a network of holes in the sacrificial material, the holes having the desired shape of the moving elements;

a step of depositing materials constituting the moving elements, the materials being deposited on the whole of the support;

a step of removing the sacrificial material, so that only the moving elements remain on the support; and a step of freeing the moving parts from the support while conserving an anchoring point to the support.

An aspect of the invention also relates to a method of mapping a magnetic field, the magnetic field being in a zone, the method comprises the following steps:

a step during which a magneto-optic surface according to any one of the previously described embodiments is arranged in the zone;

a step of observing the image of the magneto-optic surface, the amplitude of the local deflections of the light from the magneto-optic surface being the image of the spatial distribution of the magnetic field, the magneto-optic surface being illuminated by a light source.

The observation of the image of the magneto-optic surface modified under the effect of the external magnetic field makes it possible to have an image of the characteristics of this magnetic field.

An aspect of the invention also relates to a method of detecting electrical conductivity inhomogeneity in an electrically conducting object, the method comprising the following steps:
- a step of injecting a current into the electrically conducting object;
- a step of observing a magneto-optic surface according to any one of the previously described embodiments, the magneto-optic surface being arranged above the object and the magneto-optic surface being illuminated by a light source, the step of observing being carried out by a receiver;

an inhomogeneity in a zone of the object being detected by a modification of the optical properties of the magneto-optic surface at the level of the zone of the object under the action of the modification of the magnetic field brought about by the deviation of the current by the inhomogeneity. The external light source may be a natural or artificial light source. The observation of the magneto-optic surface takes place by a receiver which may be the naked eye, a microscope or an optical detector.

An aspect of the invention also relates to a diffraction network comprising a magneto-optic surface according to one of the previously described embodiments, the moving elements having the same shape and the same dimensions and being laid out so as to diffract light emitted by an external light source.

BRIEF DESCRIPTION OF DRAWINGS

Other characteristics and benefits of the invention will become clearer on reading the description that follows, with reference to the appended figures, which illustrate:

FIG. 3A is a side view of the moving element, the external magnetic field being zero; FIG. 3B is the side view of the moving element, the external magnetic field being non-zero; FIG. 3C is a top view of the moving element;

FIGS. 4A and 4B are views obtained by optical detector of a magneto-optic surface according to an embodiment of the invention. FIG. 4B is an enlarged view of a zone of the optic surface of FIG. 4A;

FIGS. 5A, 5B and 5C are schematic views of three variants of embodiment of a magneto-optic surface subjected to a zero external magnetic field;

FIGS. 6A and 6B are schematic views of three variants of embodiment of a magneto-optic surface subjected to a zero external magnetic field;

FIG. 12A is a schematic view of the steps of a method of manufacturing a magneto-optic surface according to an embodiment of the invention and FIG. 12B, a schematic top view of the magneto-optic surface obtained by the method of manufacturing of FIG. 12A;

For greater clarity, identical or similar elements are marked by identical reference signs in all of the figures.

A Cartesian coordinate system (0; x, y, z) is represented in certain figures in order to aid in better understanding.

DETAILED DESCRIPTION

Figure 1:
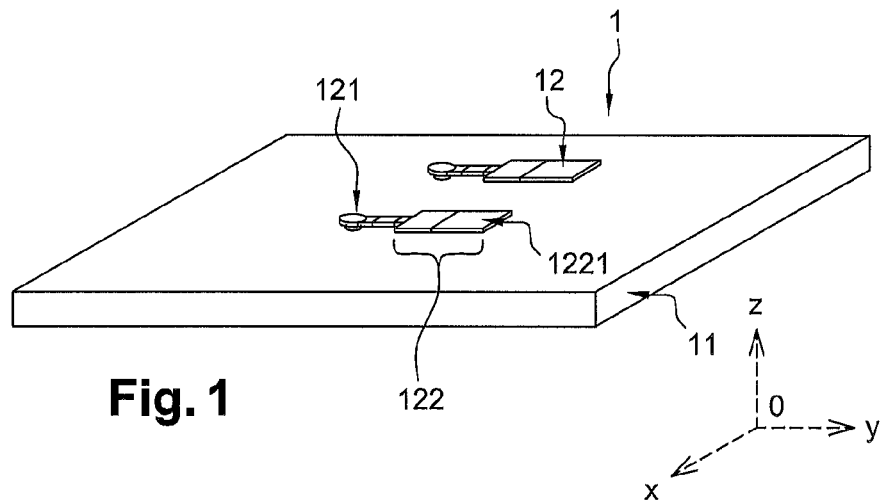
FIG. 1 is a schematic view of a magneto-optic surface according to an embodiment of the invention.

FIG. 1 represents a magneto-optic surface 1 comprising a support 11 and two moving elements 12.

The support 11 may be opaque (for example made of silicon) or transparent (for example made of glass, quartz); and may be solid or supple (for example made of polymer). It is constituted for example of a thin substrate of silicon or glass or quartz, material easily compatible with micro- or nanoelectronic manufacturing techniques (in the case where the moving elements are of microscopic or nanoscopic size), but also of any other material and stemming from any other manufacturing technique.

The two moving elements 12 are anchored to the surface of the support 11 by an anchoring point 121 and their moving part 122 is free to move with respect to the support. The moving elements 12 are thus partially detached from the support 11, and partially anchored to the support 11.

The moving part 122 of the moving elements comprises a magnetic part 1221, the magnetic moment of which is represented by an arrow in the figures. The moving parts 122 of the moving elements 12 of FIG. 1 comprise two magnetic parts 1221. The magnetic moment of the magnetic parts 1221 tends to align itself on the magnetisation vector of an external magnetic field, which brings about a movement, with respect to the support 11, of the moving part 122 of the moving elements 12 under the effect of the external magnetic field. This movement of the moving elements 12 modifies the image of the magneto-optic surface 1 observable by a receiver.

The shapes of the moving magnetic elements are indifferent, from simple filament, appendage, or magnetic beam, lozenge, to more complex varied shapes, such as triangles, crosses, stars, or any other shape, or for example geometries with several branches. However, in an embodiment, these elements are optimised to give to the freed part: good mobility, flexibility, suppleness; a sufficient reflecting surface; and a sufficient magnetism for actuation by an external magnetic field.

Figure 2A:
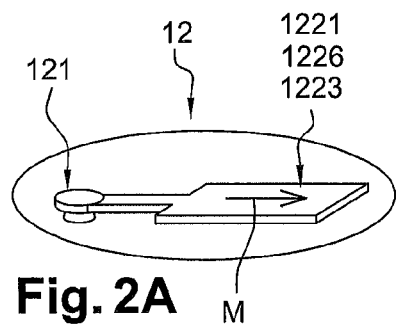
FIGS. 2A, 2B and 2C are schematic views of three variants of embodiment of a moving element of a magneto-optic surface.
Figure 2B:
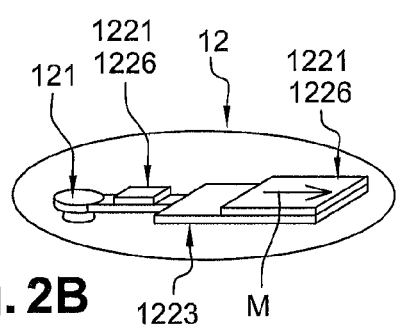
Figure 2C:
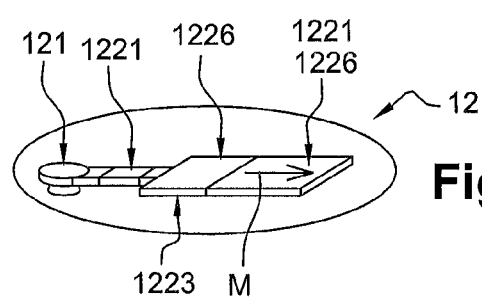

FIGS. 2A to 2C represent variants of embodiments of moving elements 12.

The moving element 12 of FIG. 2A is composed of an all in one piece material. The all in one piece material is magnetic 1221, flexible 1223 and reflecting 1226, for example a nickel-iron (NiFe) alloy. It is attached to the support 11 by an anchoring point 121 composed of a part of the moving element 12 and of a pad which unifies it to the support.

The moving element 12 of FIG. 2B is composed of a non-magnetic flexible layer 1223 supporting pads of magnetic and reflecting material 1221, 1226. The anchoring point to the support 121 is here made of a material different from the moving part 122 and comprises a pad which unifies it to the support 11.

The moving element of FIG. 2C is composed of a thin flexible sub-layer 1223 on which are deposited magnetic 1221 and/or reflecting 1226 and/or flexible materials.

Flexibility is obtained for materials of not very high Young's modulus. For example, a layer of aluminium is more flexible than a layer of NiFe of same geometry, in fact:

Young's modulus of Al: 69 GPa;
Young's modulus of Fe: 196 GPa; and
Young's modulus of Ni: 214 GPa.

If the moving element is deposited on the support in the plane xOy (case of FIG. 1 for example), to obtain a good flexibility in the vertical plane yOz, the thickness along Oz may be minimised and the length along Oy maximised. An example of embodiment of such a flexible moving element is the following: a thin sub-layer of aluminium (of thickness 60 nm, length 100 µm, width 5 µm) is sufficiently flexible and it can support by part only thicker magnetic pads of NiFe (of thickness 120 nm), NiFe material which would make the element more rigid if they were deposited with 120 nm of thickness over the whole moving surface. On the other hand, pads of NiFe of thickness 120 nm and of only 5 µm×5 µm surface deposited on the flexible sub-layer of aluminium do not hinder the flexibility of the aluminium and produce sufficient magnetic forces to actuate the moving element.

Any flexible and sufficiently resistant, non-brittle material which can withstand the depositing of magnetic materials may be used to form a flexible part of the moving part:
  sufficiently thin metal layers: metals with lower Young's moduli than the magnetic materials used (Al, Au, Mg, etc.);
  alloys (alloys of Cu, etc.);
  polymers;
  resins;
  biological materials (DNA, etc.); etc.

In order to obtain sufficient sensitivity and reactivity of the moving elements to the external magnetic field, giving the moving elements a lengthened shape is particularly well suited. In fact, a lengthened magnetic material has the benefit of having shape anisotropy and thus a magnetisation oriented along the major direction, hence an efficient magnetic couple for orienting the material under the effect of an external magnetic field.

The weaker the applied field to map, the more sensitive needs to be the moving elements. A high sensitivity to a weak magnetic field requires:
  great flexibility, mechanical suppleness;
  high magnetisation and magnetic susceptibility of the magnetic materials;
  few internal mechanical stresses opposing the magneto-mechanical action.

Examples of magnetic materials having such characteristics are:
  hard magnetic materials of the type:
    magnets, for example NdFeBr;
    multilayer magnetic materials—ferromagnetic material, or SAF (synthetic antiferromagnetic)—coupled to an antiferromagnetic material;
  soft magnetic materials of the Permalloy type (NiFe), CoFeB.
  magnetic stacks of the type:
    mono or multilayer; particularly coupled through non-magnetic spacers;
    SAF (synthetic antiferromagnetics);
    superparamagnetics (for example NiFe of diameters of several nanometers);
  also magneto-elastic or magnetostrictive materials, etc.

Figure 3A:
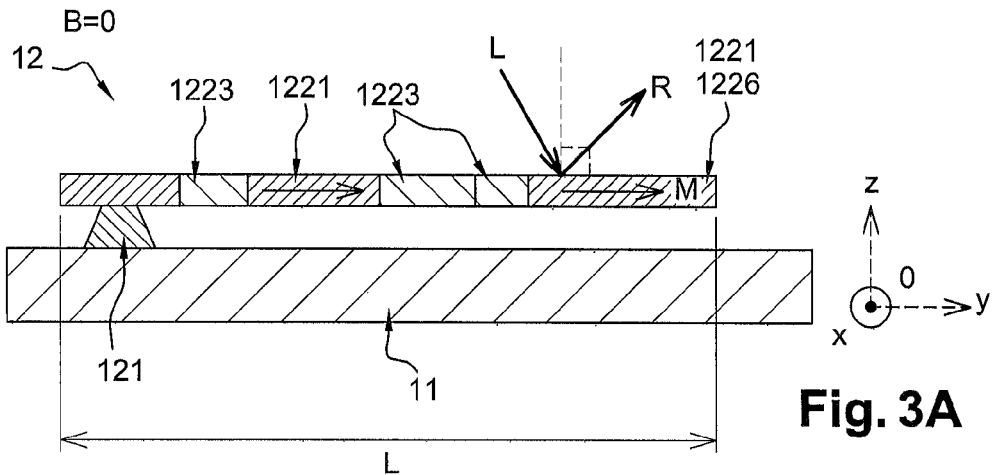
FIGS. 3A, 3B and 3C are schematic views of a variant of embodiment of a moving element of a magneto-optic surface.
Figure 3B:
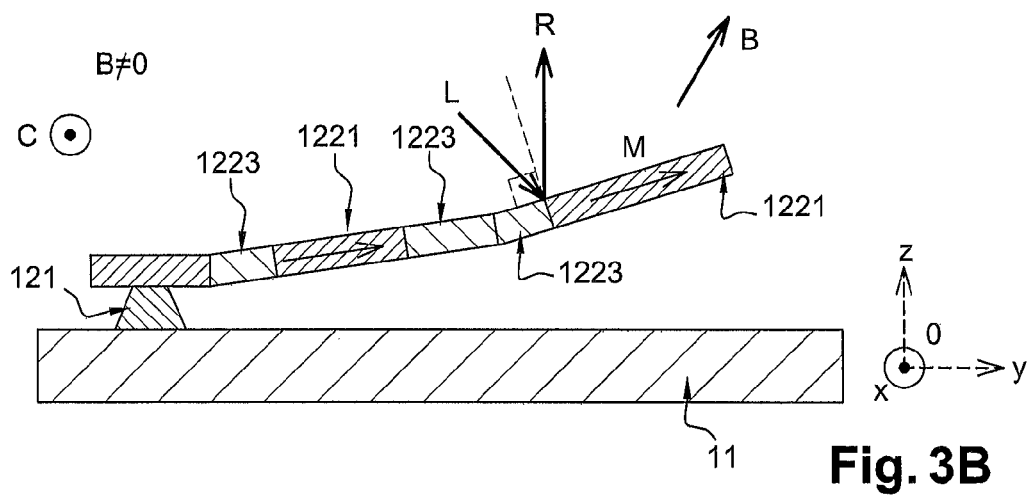
Figure 3C:
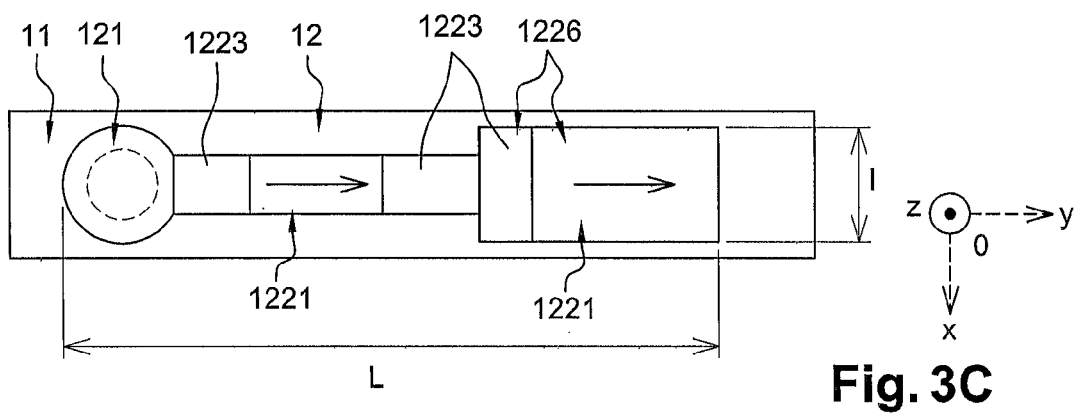

Moreover, in order to improve the flexibility and the suppleness of the moving part of the moving element, it is appropriate that its width is much less than its length. A moving part having a flat and wide surface further enables good reflection of light. FIGS. 3A to 3C illustrate a moving element 12 having such characteristics.

The moving element 12 of FIGS. 3A to 3C has two lengthened magnetic parts 1221, having shape anisotropy (their magnetic moment M is represented by an arrow and oriented in the sense of the length L of the moving element 12). The greatest width l of the moving part 122 of the moving element 12 is much less than the length L of the moving element 12, this is particularly visible in FIG. 3C which is a top view of the moving element 12 and of the support 11. This has the benefit of improving the flexibility and the suppleness of the moving part 122 of the moving element 12 and thus making the detection of a weak magnetic field easier. Moreover, the moving element 12 of FIGS. 3A to 3C comprises several flexible parts 1223 connected together by less flexible sub-parts (among others the magnetic parts 1221) in a "cantilever" type configuration. The reflecting part 1226 of the moving element 12 has a higher surface than the rest of the element which has the effect of improving the reflection of light and improving the detection of modifications of the image of the magneto-optic surface under the effect of an external magnetic field. In order to even further improve the contrast, and thus to facilitate the detection of modifications of the image of the magneto-optic surface under the effect of an external magnetic field, the support 11 may be, in a particularly beneficial manner, absorbent. Thus, by having a moving element 12, the reflecting part 1226 of which has a greater surface than the remainder of the moving element 12, on an absorbent support, the detection of modifications of the image of the magneto-optic surface under the effect of an external magnetic field will be improved. It is also possible, unlike the preceding case, to use absorbent moving elements 12, arranged on an entirely reflective support 11, which has the effect of improving the detection of the modifications of the image of the magneto-optic surface under the effect of an external magnetic field. FIG. 3A represents the moving element 12 subjected to a zero external magnetic field zero (B=0), it finds itself in a first equilibrium position. An incident light beam L reflects on the moving part 12 in a reflected light beam R. The incident light beam L comes from an external light source (natural or artificial) and the reflected light beam R is observable by a receiver.

FIG. 3B represents the same moving element 12, subjected to a non-zero external magnetic field (B≠0), the magnetisation vector B of which is represented by an arrow in FIG. 3B. The two magnetic parts 1221 have a magnetic moment M and a volume V. Under the effect of the external magnetic field B, the magnetic moment of each of these magnetic parts 1221 seeks to align itself on the magnetisation vector B, carrying along the magnetic parts 1221 which move in such a way as to orient their magnetic moment M along B and the magnetic parts 1221 bring about a movement of the moving part 12 relatively with respect to the support 11. The magneto-mechanical couple C behind the movement of a magnetic part 1221 is proportional to the magnetic moment M of this magnetic part 1221, to the volume V of this magnetic part 1221 and to the value B of the magnetisation vector to which the magnetic part 1221 is subjected. Only the moving part 12 moves with respect to the support under the effect of the external magnetic field B, the anchoring point 121 remains fixed with respect to the support. FIG. 3B corresponds to a second equilibrium position of the moving element 12 after the movement of the moving part 122 of the moving element 12 under the action of the external magnetic field B. The reflected light beam R is deviated with respect to FIG. 3A, thus the image observable by a receiver R of the magneto-optic surface comprising the support 11 and the moving element 12 is modified. This modification of the image is the sign of the presence of an external magnetic field.

FIG. 4A is a photo by optical microscopy of a magneto-optic surface 1 comprising a support 11 and moving elements 12 of microscopic size (length l of the moving part 12 of 60 µm). FIG. 4B is a photo by scanning electron microscope of a zone of the magneto-optic surface of FIG. 4A. In these figures, the magneto-optic surface is subjected to a zero external magnetic field. The moving elements 12 are fixed to the support by their anchoring point to the support 121. In this first equilibrium position for a zero external magnetic field, the moving part 122 of the moving elements is oriented upwards (the opposite way from the support 11). This is due to the internal stresses of the materials constituting these elements (here made of NiFe) which orients them spontaneously upwards.

FIGS. 5A to 5C are schematic views of a magneto-optic surface 1 when the external magnetic field is zero B=0. The angle θ marks the inclination of the moving elements 12 with respect to the plane of the support 11, in zero field. Between the three FIGS. 3A to 3C, the angle θ is different. In fact, this angle varies as a function of the internal stresses and external forces (for example due to the medium in which the magneto-optic surface 1 is immersed) acting on the moving parts 122 of the moving elements 12. The stresses are intrinsic to the materials, or instead may be due to the differences in stresses between the layers of different superimposed materials. In FIGS. 5A to 5C, for a zero external magnetic field, the moving elements 12, anchored to the support by their anchoring point 121, are oriented along z>0. This embodiment is also as well suited to an operation in which the properties of the surface are modified in reflection as to an operation in which the properties of the surface are modified in transmission. In reflection, the light source and the receiver will both be placed on the side of the face of the magneto-optic surface where the moving elements are located (in the case of FIG. 5, side z>0), the support being any support. In reflection, in the case where the support is opaque, the receiver must be placed above the magneto-optic surface 1, in other words on the z>0 axis (case of FIG. 5) for a height z greater than that of the surface 1. In transmission, the light source and the optical detector will be placed on either side of the surface: in the case of FIG. 5, the light source is situated on the side of z<0 and the receiver on the side of z>0, the support having to be transparent in the case of a use in transmission.

In the case of FIGS. 5A, 5C, and optionally 5B, the moving elements 12 must be sufficiently rigid in order to remain in the desired position in countering their own weight. They thus have to be dimensioned to withstand gravity. This increase in their dimension and/or this increase in their stiffness, in order to withstand gravity, degrades their capacity to deform under the effect of a magnetic field and thus degrades their sensitivity to an external magnetic field. In order to overcome this problem, it may be beneficial to place the moving elements on the underneath face (in FIGS. 5A, 5B, 5C, on the side of z<0) so as to orient them downwards with an angle θ that results from the equilibrium between their weight and the intrinsic mechanical forces. This downwards orientation of the moving elements is illustrated in FIGS. 6A and 6B. Thus, the elements may be thinned, lightened in order to make them much suppler and thus much more sensitive to an external magnetic field. In the cases illustrated in FIGS. 6A and 6B, an operation in reflection or in transmission, as described in the preceding paragraph, with reference to FIGS. 5A to 5C, is possible.

FIGS. 7A, 7B, 8A and 8B illustrate, in a schematic manner, an example of use in reflection of a magneto-optic surface 1 in order to detect the presence of an external magnetic field B and map it. The surface 1 comprises a support 11 opaque to the light emitted by an external light source 2, arranged on the side of the z>0 axis. A receiver 5 is placed above the surface 1, i.e. on the z>0 axis for a height z greater than that of the surface 1. The receiver 5 looks at the image of the surface 1 bearing the moving elements 12 from above in reflection. The object is illuminated from above, the incident light beams L reflect on the moving elements 12.

Figure 7A:
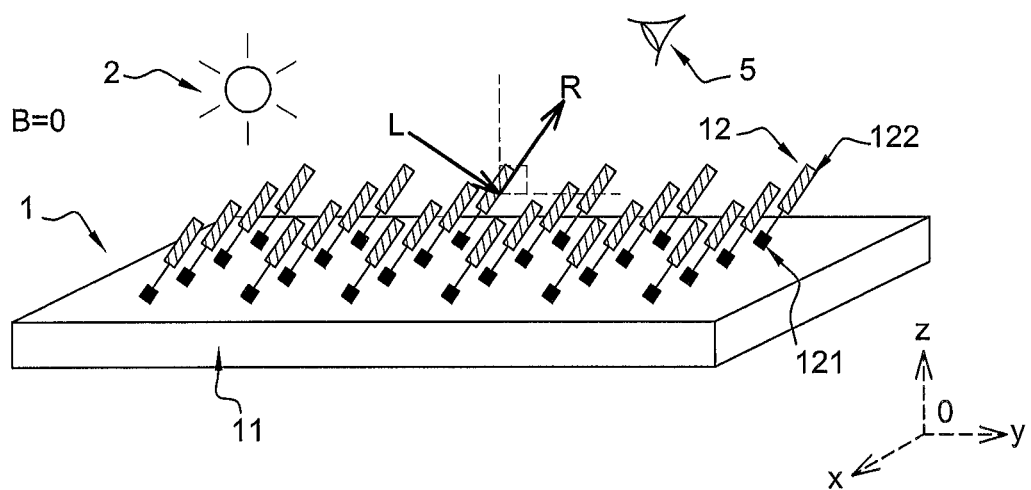
FIG. 7A is a schematic view of a magneto-optic surface according to an embodiment of the invention subjected to a zero external magnetic field and FIG. 7B is a schematic view of the mapping of the external magnetic field (here zero) observed by a receiver arranged above the magneto-optic surface of FIG. 7A.
Figure 7B:
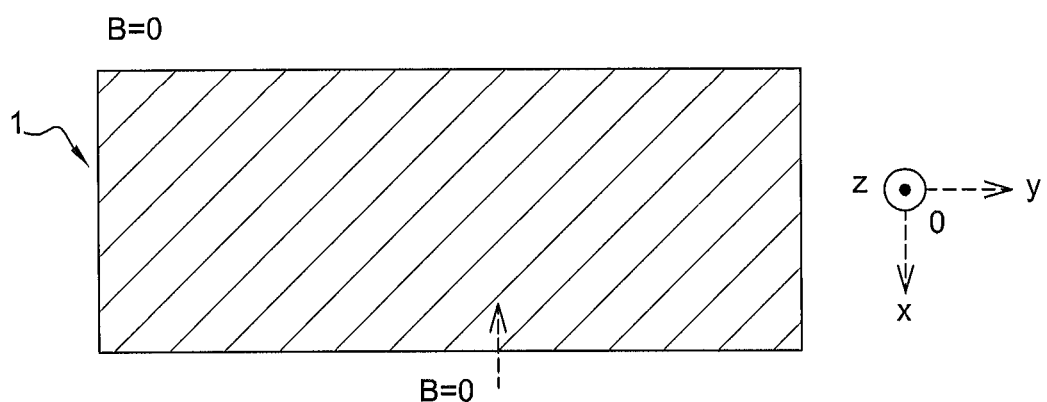

FIGS. 7A and 7B correspond to the case where the magneto-optic surface 1 is subjected to a zero external magnetic field. All the moving elements 12 are in a same first equilibrium position (visible in FIG. 7A) and the image of the surface 1, obtained by the reflection by the magneto-optic surface of the light emitted by the source 2 is uniform, as visible in FIG. 7B.

Figure 8A:
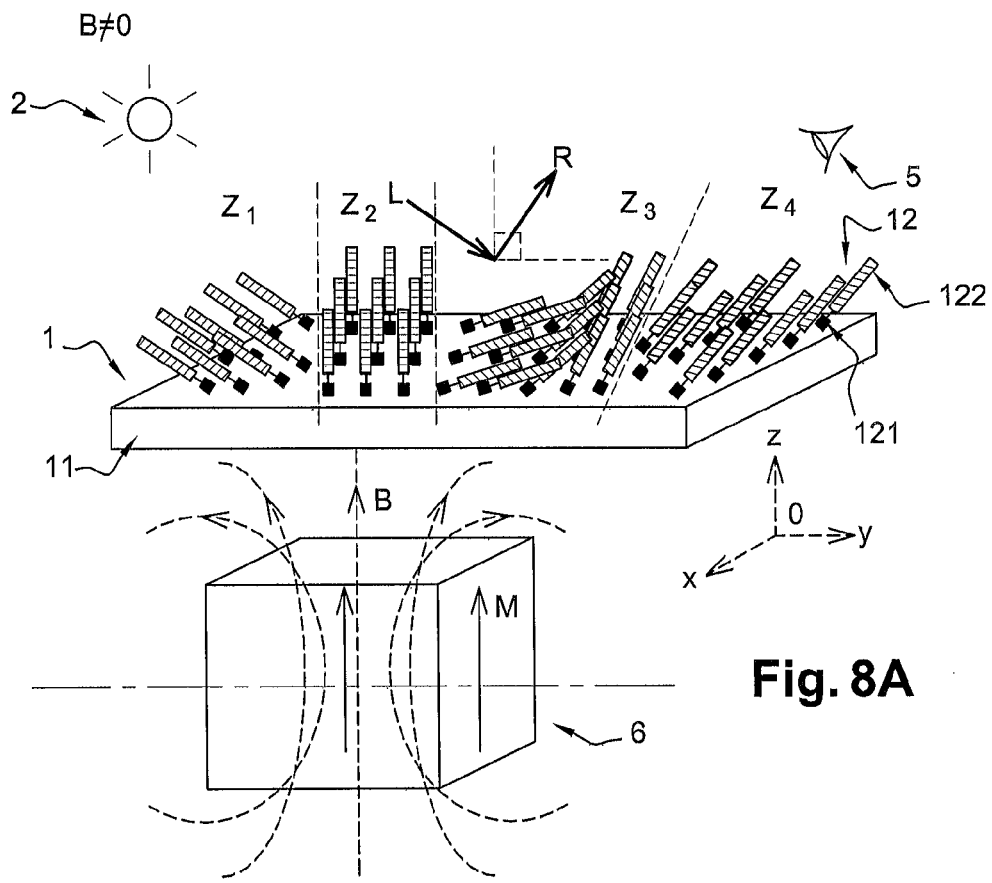
FIGS. 8A and 8B are, respectively, a schematic view of the magneto-optic surface of FIG. 7A subjected to a non-zero external magnetic field and a schematic view of the mapping of the non-zero external magnetic field observed by a receiver arranged above the magneto-optic surface of FIG. 8A.
Figure 8B:
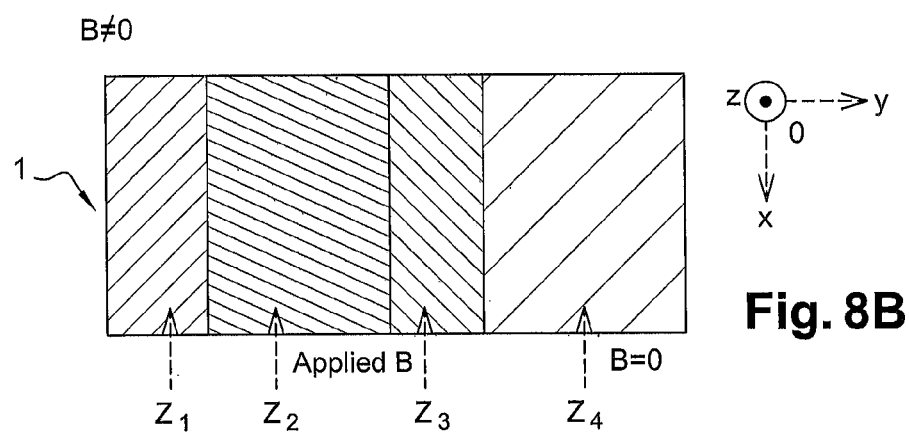

FIGS. 8A and 8B correspond to the case where the magneto-optic surface 1 is subjected to a non-zero external magnetic field B, created by a magnet 6 arranged below the surface 1 of FIG. 7A. The moving part 122 comprising a magnetic part, it moves under the effect of the magnetic field B. The magnetic moment of the magnetic part of the moving part 122 of the moving elements 12 tends to align itself with the magnetisation vectors resulting from the magnet 6. It may be seen in FIG. 8A that certain moving elements have remained in their first equilibrium position (at the end of surface 1 in zone Z4), because not subjected to the field B; whereas other moving elements 12 are in a second equilibrium position (in the zones Z1, Z2 and Z3) which depend on the magnetisation vector to which they are subjected. The image of the surface 1, observed in reflection by a receiver 5 is visible in FIG. 8B. Four zones (Z1, Z2, Z3 and Z4) are visible which correspond to the zones of the same name in FIG. 8A.

FIGS. 9A, 9B, 10A and 10B illustrate, in a schematic manner, an example of use in transmission of a magneto-optic surface 1 in order to detect the presence of an external magnetic field B and to map it. The surface 1 comprises a support 11 transparent to the light emitted by an external light source 2, arranged on the side of the z<0 axis. A receiver 5 is placed on the side of the z>0 axis, i.e. above the surface 1. The receiver 5 looks at the image of the surface 1 bearing the moving elements 12 from above in transmission. The object is illuminated from below, the incident light beams L reflect on the moving elements 12. The moving elements 12, not transparent, by their presence, have an influence on the quantity of light transmitted (corresponding to the transmitted light beam T) by the transparent support 11.

Figure 9A:
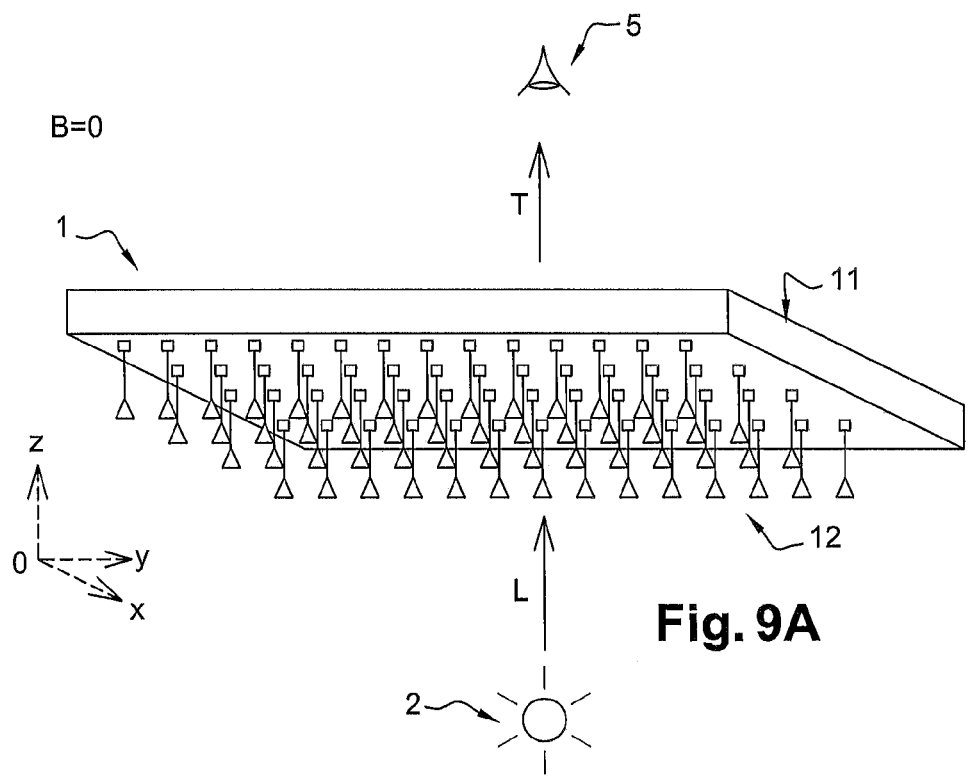
FIG. 9A is a schematic view of a magneto-optic surface according to an embodiment of the invention subjected to a zero external magnetic field and FIG. 9B is a schematic view of the mapping of the external magnetic field (here zero) observed by a receiver arranged above the magneto-optic surface of FIG. 9A.
Figure 9B:
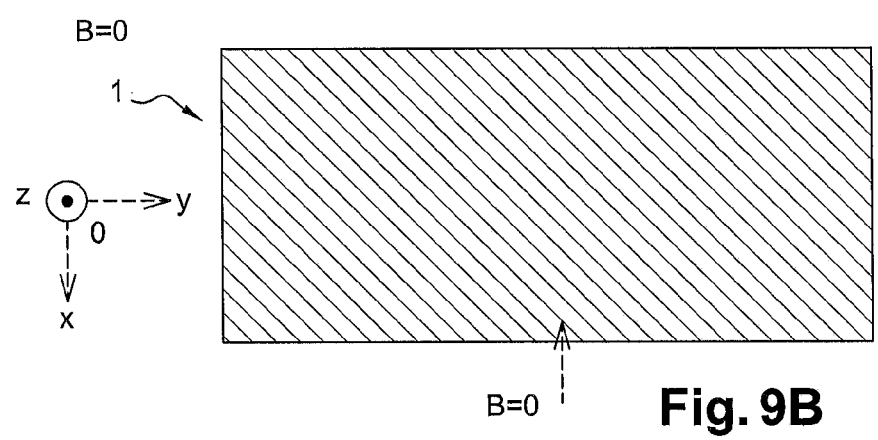

FIGS. 9A and 9B correspond to the case where the magneto-optic surface 1 is subjected to a zero external magnetic field B. All the moving elements 12 are in a same first equilibrium position (visible in FIG. 9A) and the image of the surface 1, obtained by transmission by the magneto-optic surface of the light emitted by the source 2 is uniform, as visible in FIG. 9B. In this embodiment, the moving elements 12 hang below the surface 1 on the side of the external light source 2.

Figure 10A:
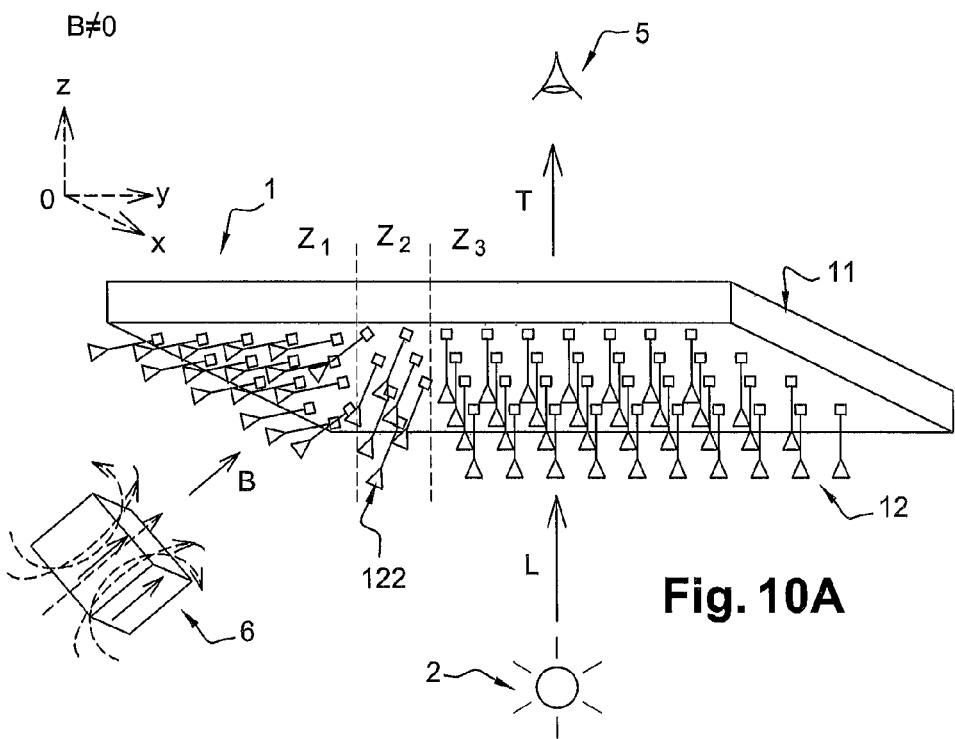
FIGS. 10A and 10B are, respectively, a schematic view of the magneto-optic surface of FIG. 9A subjected to a non-zero external magnetic field and a schematic view of the mapping of the non-zero external magnetic field observed by a receiver arranged above the magneto-optic surface of FIG. 10A.
Figure 10B:
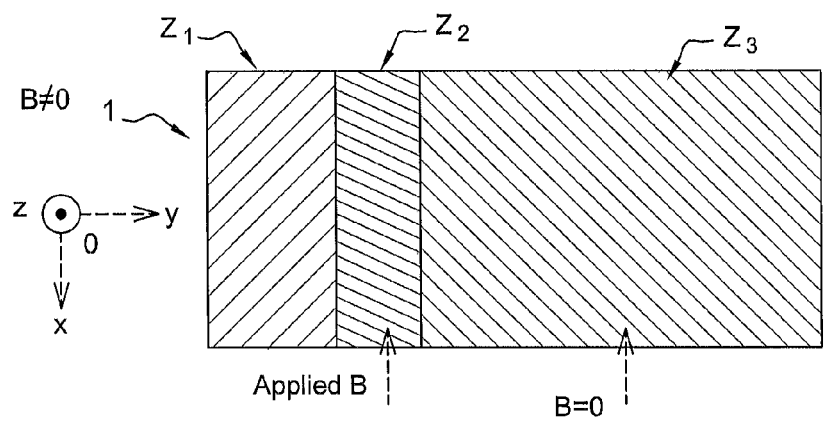

FIGS. 10A and 10B correspond to the case where the magneto-optic surface 1 is subjected to a non-zero external magnetic field B, created by a magnet 6 arranged below the surface 1 of FIG. 9A. The moving part 122 comprising a magnetic part, it moves under the effect of the magnetic field B. The magnetic moment of the magnetic part of the moving part 122 of the moving elements 12 tends to align itself with the magnetisation vectors resulting from the magnet 6. It may be seen in FIG. 10A that certain moving elements have remained in their first equilibrium position (zone Z3), because not subjected to the field B, but other moving elements 12 are in a second equilibrium position (zones Z1 and Z2) which depends on the magnetisation vector to which they are subjected. The image of the surface 1, observed in transmission by a receiver 5, is visible in FIG. 10B. Three zones (Z1, Z2 and Z3) are visible, which correspond to the zones of the same name in FIG. 10A.

Figure 11A:
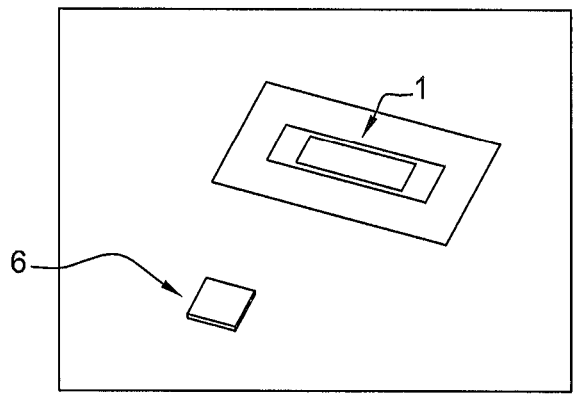
FIGS. 11A to 11C are views obtained by an optical detector of a magneto-optic surface according to an embodiment of the invention, the surface being subjected to a zero (FIG. 11A) and non-zero (case of FIGS. 11B and 11C) external magnetic field.
Figure 11B:
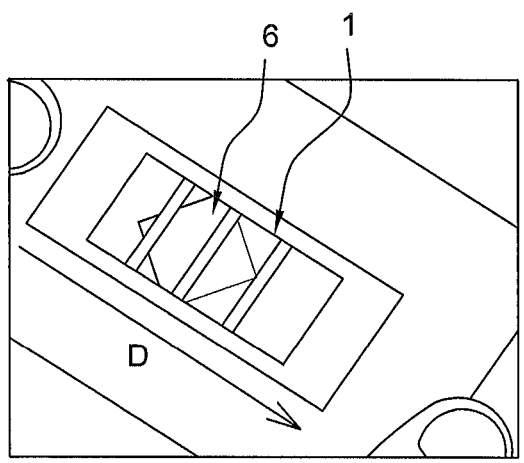
Figure 11C:
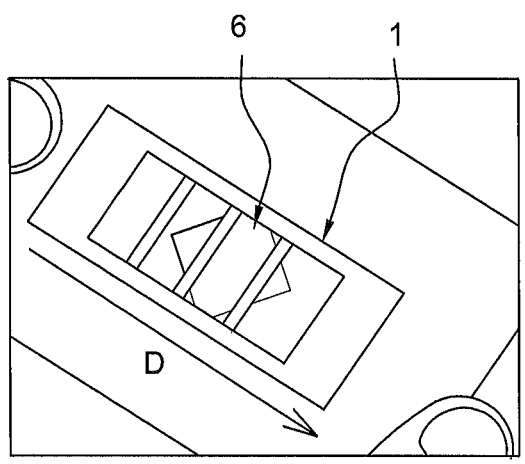

FIGS. 11A (zero external magnetic field) and 11B, 11C (non-zero external magnetic field) are photos of a magneto-optic surface 1, the moving elements of which are not visible individually due to their microscopic size. A magnet 6 made of magnetic material NdFeBr (visible in FIG. 11A) is moved under the surface 1 (FIGS. 11B and 11C). The observer looks at the surface from above, in reflection. Although the support is opaque, the shape of the magnet 6 is visible in the surface 1, it seems to be transparent to light. The shape of the magnet 6 is due to the movement of the microscopic moving elements on the support. By comparing FIGS. 11B and 11C, the movement of the magnet from left to right is visible (along the arrow D). The image obtained is a mapping of the magnetic field B radiated by the magnet 6.

Overall, the magnetic field modifies the initial image of the surface, in the first equilibrium position, for a zero magnetic field. The magnetic field mapping shows qualitative field variations, and may also be interpreted more finely to obtain quantitative information on the magnetic field to be visualised, as a function of the geometries and materials forming the moving surface elements. For quantitative field measurements, a measuring chain, including an optical detector, needs to be calibrated as a function of the applied field.

FIG. 12A illustrates the different steps of a method of manufacturing a magneto-optic surface for a magneto-optic surface comprising moving elements of micrometric size. This example of method of manufacturing implements microelectronic techniques. Before step A, a step of depositing a layer of sacrificial material 7 on the support 11 takes place. The sacrificial material 7 may be a photosensitive resin. The support is here made of silicon.

Step A, illustrated in FIG. 12A, is a step of forming a network of holes 71 in the sacrificial material, the holes 71 having the shape of the moving elements with which it is wished to provide the support 11. Between the holes 71, are located pads of sacrificial material which correspond to the space between the moving elements of a magneto-optic surface. The techniques used to form these holes 71 may be photolithography (optical UV, DUV, or electronic) for elements of size greater than 1 µm; or in the case of elements of nanometric size: nanoprinting for elements of size greater than 20 nm or masking using diblock co-polymer techniques for elements of size greater than 3 nm. The pattern formed by a hole defines an anchoring point to the support of the moving element and the moving part of the moving element.

Step B, illustrated in FIG. 12A, is a step of depositing on the support 11 materials 123 constituting the moving elements. The depositing of the materials can take place via techniques of cathodic sputtering, evaporation, electrodeposition or spin coating, etc. In the embodiment example illustrated in FIG. 12A, the moving element is constituted of a stack 123 of thin layers of materials, each thin layer having a particular role:

a flexible layer 1231 or forming a protective layer (for step D of freeing the moving parts), formed of flexible materials, and/or protecting a magnetic layer 1232 because resistant to the isotropic etching of the silicon (carried out during step D in this embodiment example). Such materials may be aluminium or platinum;

a layer (or a multilayer) 1232 of magnetic material(s), (soft and/or hard, mono and/or multilayer e.g. CoFeB; NiFe; or (NiFe/Ru)$_7$NiFe) with optionally non-magnetic spacers arranged between the different layers of magnetic materials when it involves a magnetic multilayer. The magnetic material may itself be flexible, depending on its compositions, widths, thicknesses; and a reflective layer 1233, non-magnetic (optional because the reflection may take place on the magnetic material itself).

Step C, illustrated in FIG. 12A, is a step of removing the sacrificial material, here by dissolution by a suitable solvent. It may be seen in step C that only the moving elements 12 remain on the support 11, spaced apart.

Step D, illustrated in FIG. 12A, is a step of freeing the moving parts 122 of the support 11 while maintaining an anchoring point 121 to the support 11. In the example of FIG. 12A, this step is carried out by isotropic etching of the silicon support 11. The etching, carried out by ion bombardment, has physical and chemical effects that remove the silicon but without effects on the protective layers (Example Al, Pt, etc.). The silicon is attacked in an isotropic manner, under the protective (or flexible) layers 1231 of the magnetic part 1232. The part corresponding to the anchoring point 121 to the support 11 having a centre-edge distance greater than the centre-edge distances of the part to be freed (characteristic visible in FIG. 12B), it remains fixed by a silicon pillar on the substrate, whereas the moving part 122 is freed, detached from the silicon. Other techniques of manufacturing moving elements may be envisaged. For example, the moving elements may be nanostructured (for example silicon nanowires or carbon nanotubes); formed by CVD (Chemical Vapour Deposition) growth then covered with a magnetic material by oblique incidence vapour phase deposition.

FIG. 12B is a top view of a magneto-optic surface 1 obtained following steps A to D described previously with reference to FIG. 12A.

In an embodiment, the dimensions of the moving elements are micrometric or nanometric. In this case, the object is manufactured by microelectronic or nanoelectronic techniques, the moving elements being obtained by a top-down approach, illustrated and described above with reference to FIG. 12A.

In an embodiment, at least two moving elements are spread out on the surface of the object, but its surface is covered with an important number of moving elements of much reduced dimensions. The fact of increasing the population density of the moving elements, (the number of elements per surface unit, or the number of elements per surface observed), will improve the performances of the magneto-optic surface. A high number of micro- or nano-moving elements with a high density on the surface of a substrate is obtained by micro- or nanoelectronic techniques. For example, for a support of which the diameter can reach several centimeters, if the surface of the support is structured in lines and columns with a step of 3 μm between each moving element, if each moving element is a rectangle of 1 μm×2 μm, placed with a step of 3 μm, a surface of 1 cm$^2$ supports around 10$^7$ thereof, corresponding to 7.8 10$^9$ moving elements on a plate of 30 cm diameter.

At least two moving magnetic elements are spread out on the surface of the object but, in an embodiment, its surface is covered with a high number of moving elements of much reduced dimensions. Increasing the population density of the moving elements, (in the absolute the number of elements per unit of surface, or another criterion being the number of elements per surface observed), will improve the performances of the object. A high number of moving magnetic micro- or nano-elements, with a high density on the surface of a substrate, is typically obtained by micro- or nanoelectronic techniques.

The dimensions of the magneto-optic surface may be other than micro- or nanometric. For example, seen from a satellite, a desert extending over a surface of 100 km×100 km, covered with 1010 solar sensors with moving magnetic portions, placed with a step of 1 m side, acts as a magneto-optic surface sensitive to the magnetic field from underground, terrestrial or aerial sources.

Figure 13:
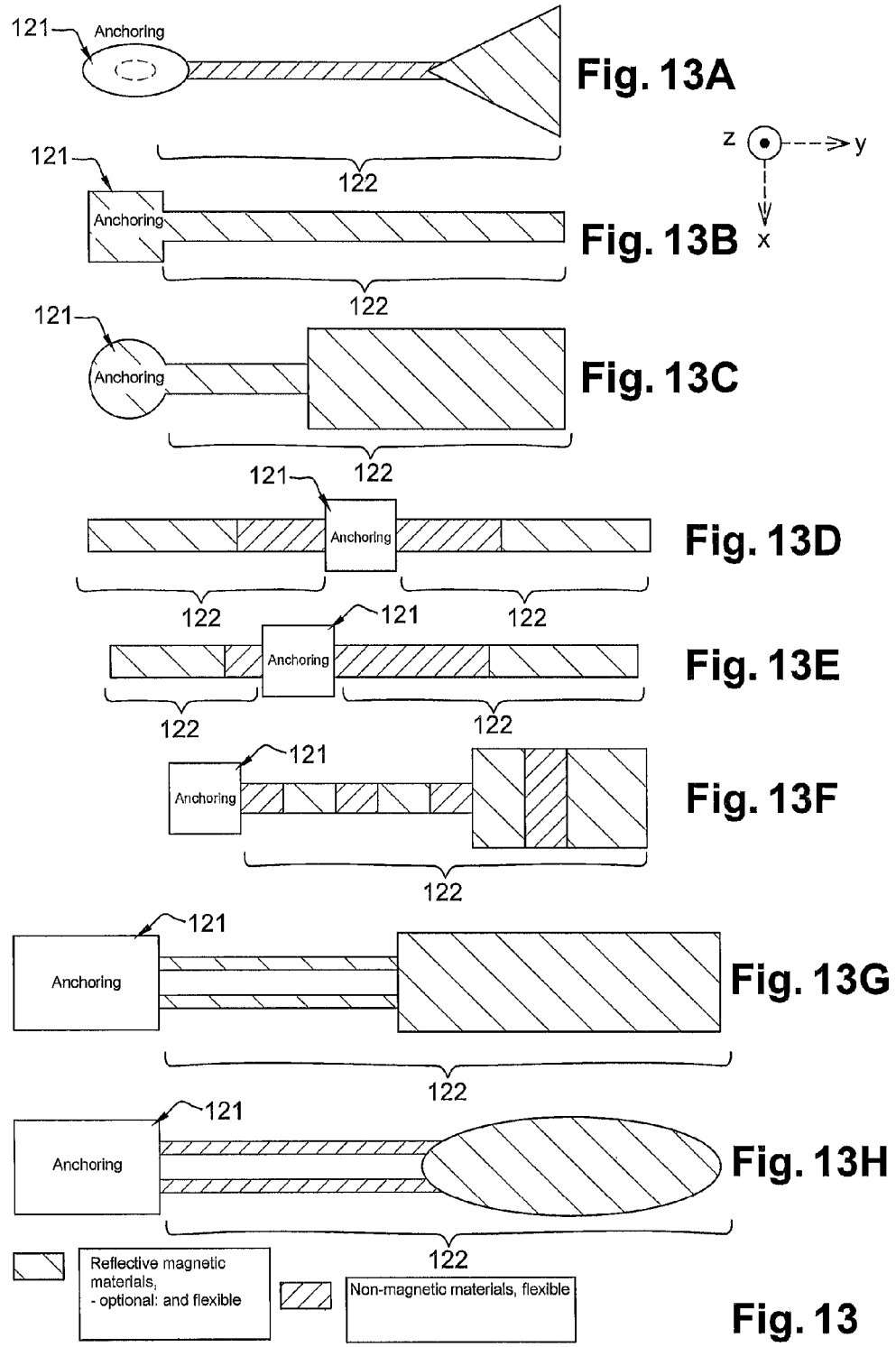
FIGS. 13A to 13H are schematic views of different variants of embodiment of a moving element of a magneto-optic surface.

FIG. 13 illustrates examples of embodiment of moving elements 12 with one or two branches, the moving part 122 being either entirely magnetic (case of FIGS. 13B, 13C, 13G), or in part covered with magnetic pads (case of FIGS. 13A, 13D, 13E, 13H). In the case of FIG. 13B, for example, the pad on the left corresponds to the anchoring point 121 to the support, a filament on the right 122 is free to move under the effect of a magnetic field. The choice of one embodiment of a moving element with respect to another is made in accordance with the values of the magnetic field to be detected, depending on the power of the light source that is available, depending on the values of the contrast between the support and the moving elements, depending on the simplicity of the manufacturing process, etc.

As regards the positioning of the moving elements on a support, multiple configurations are possible. The moving elements may be all of identical shape, all of identical composition (i.e. materials constituting them), or all different, or identical by sub-assemblies, or grouped together by sub-assemblies.

Figure 14A:
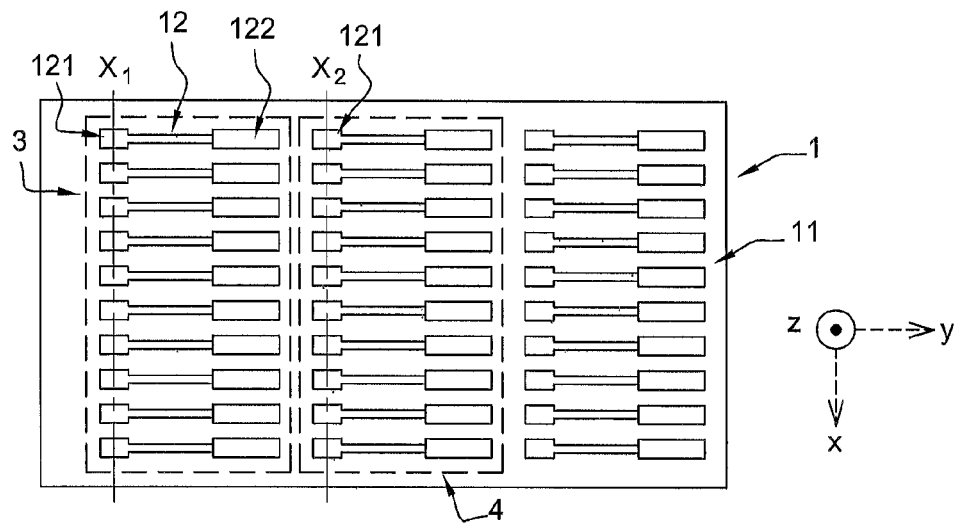
FIGS. 14A and 14B are schematic views of variants of embodiment of a magneto-optic surface.

FIG. 14A illustrates an example of possible configuration for the layout of moving elements 12 on a support 11 such that the moving elements 12 move along a same vector under the effect of a homogeneous external magnetic field. The moving elements are here all identical and spread out in two sub-assemblies: a first sub-assembly 3 comprising moving elements 12 of which each of the anchoring points 121 to the support 11 is aligned according to a first axis X1. The surface 1 further comprises a second sub-assembly 3 of moving elements 12 of which each of the anchoring points 121 is aligned along a second axis X2. Moreover each moving element 12 of the first sub-assembly 3 is juxtaposed, i.e. arranged side by side, to a moving element 12 of the second sub-assembly 4. Thus the moving elements will have a same behaviour if they are subjected to a same external magnetic field. The phenomenon of modification of the optical properties of the surface under the action of an external magnetic field is more marked for a favoured observation direction of the magneto-optic surface 1. This favoured observation direction may be an observation in oblique incidence in the framing {z>0, y<0}, or vertical to the surface (z>0). The alignment of the anchoring points is not however obligatory, the essential point is that the deformation of the moving elements under a homogeneous magnetic field is substantially the same, in the vectorial sense. A positioning of the moving elements in staggered rows may thus be envisaged.

Figure 14B:
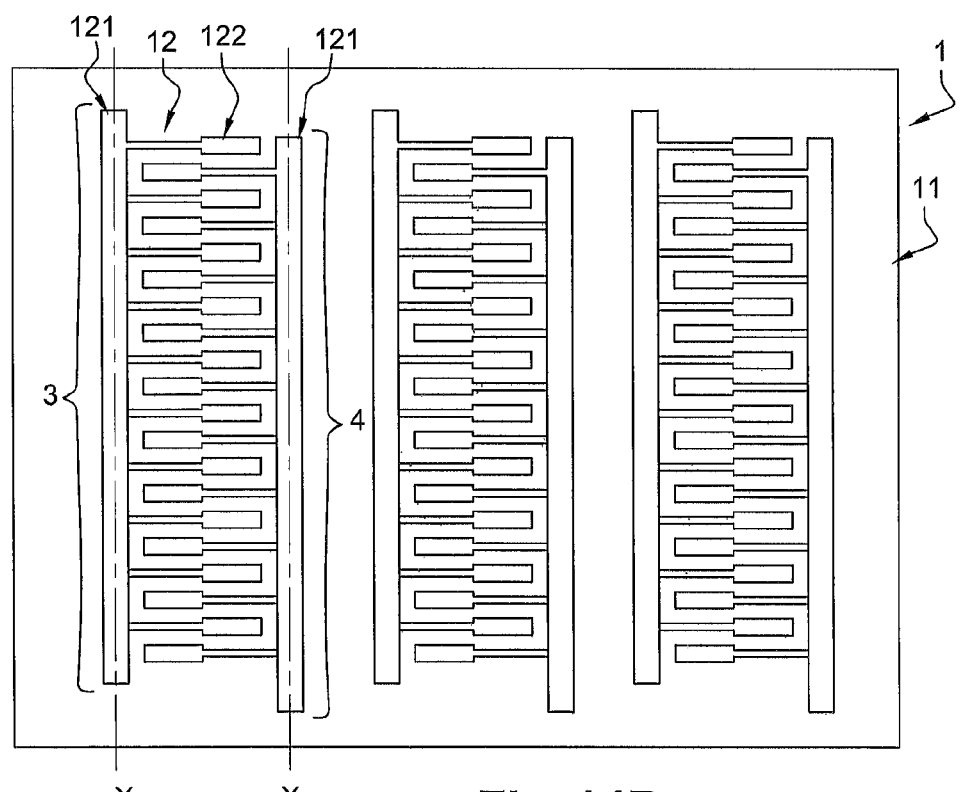

FIG. 14B illustrates another possible example of configuration of magneto-optic surface 1 for the layout of moving elements 12 on a support 11, the moving elements being spread out in two sub-assemblies such that the moving elements of the first sub-assembly move along a same first vector under the effect of an external magnetic field and that the moving elements of the second sub-assembly move along a same second vector under the effect of an external magnetic field. The moving elements of a same sub-assembly are here all identical and the first sub-assembly 3 comprises moving elements 12 of which each of the anchoring points 121 to the support 11 is aligned along a first axis X1. The surface 1 further comprises a second sub-assembly 3 of moving elements 12 (symmetrical to the elements of the first sub-assembly with respect to the plane xOz) each of the anchoring points 121 of which is aligned along a second axis X2. In FIG. 14B, each sub-assembly of moving elements (3; 4) is anchored to the support 11 by a bar 121 for anchoring to the support: the anchoring points are common to all of the moving elements of a same sub-assembly. Moreover, the moving elements are intertwined or interlaced: a moving element of the second sub-assembly 4 is arranged between two moving elements of the first sub-assembly 3. Thus the active surface of the magneto-optic surface is increased. Under the effect of a homogeneous magnetic field and perpendicular to the support, all the moving elements deform in the same manner, but in the two senses: the moving elements of the first sub-assembly deform towards {z>0; y<0} (first movement vector) and the moving elements of the second sub-assembly deform towards {z>0; y>0} (second movement vector). The phenomenon of modification of the optical properties of the surface may be observed in different directions (corresponding to different observation positions of the receiver). In the case where the detector is arranged just above the surface (along z>0), the intensity of the light observed will be higher in the case of FIG. 14B, with respect to the arrangement of the moving elements of FIG. 14A.

Figure 15A:
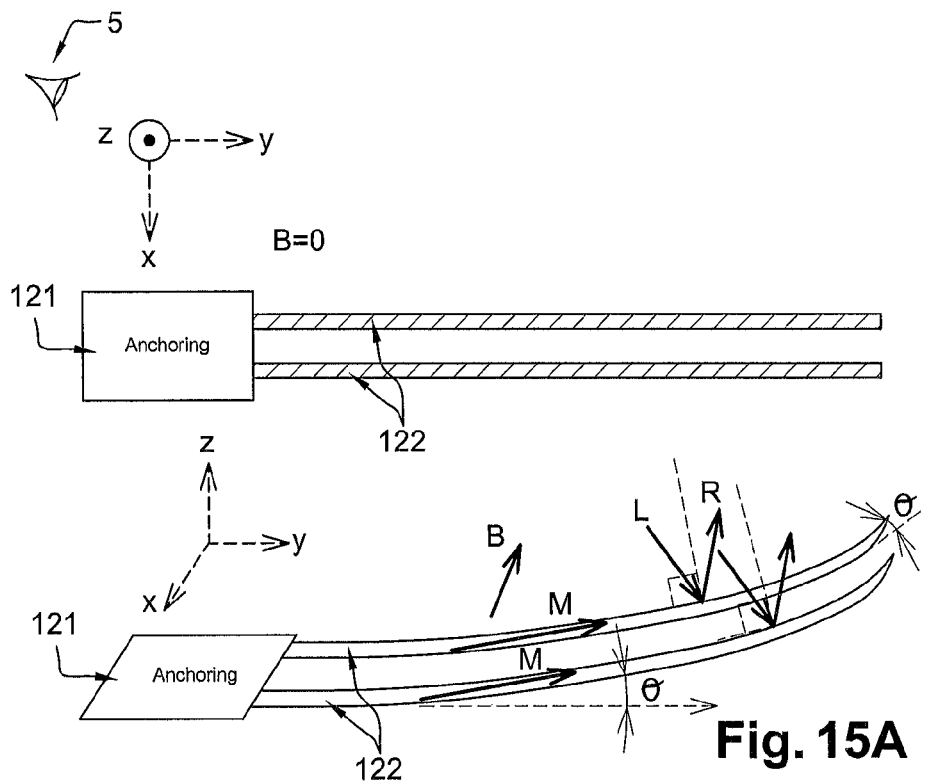
FIGS. 15A to 15C are schematic views of different variants of embodiment of a moving element of a magneto-optic surface. Each of FIGS. 15A to 15C being a view of the moving element subjected to a zero external field or subjected to a non-zero external field.
Figure 15B:
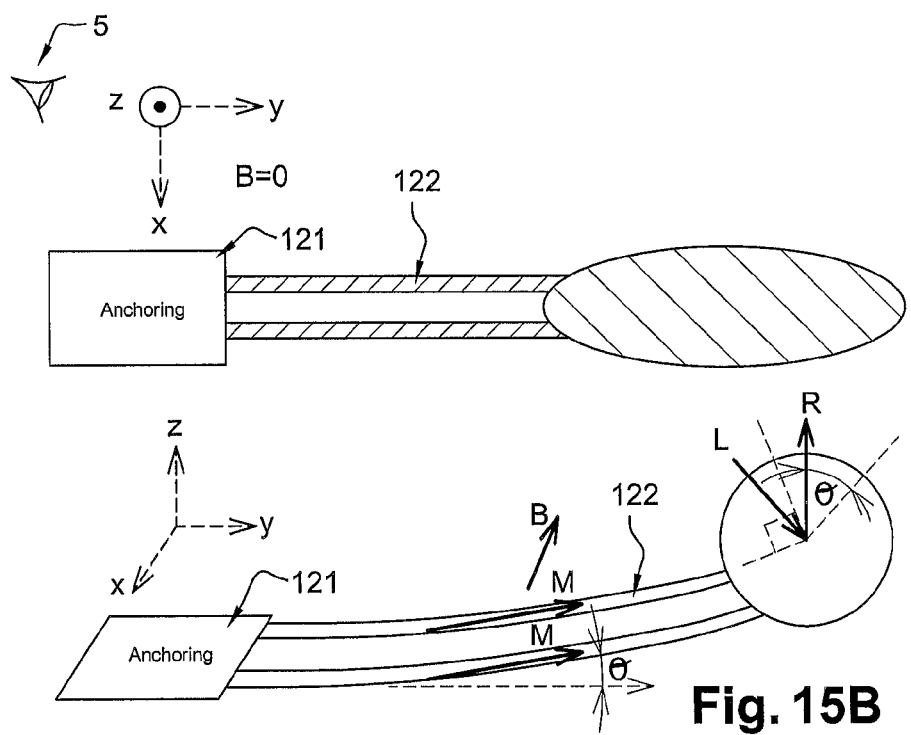
Figure 15C:
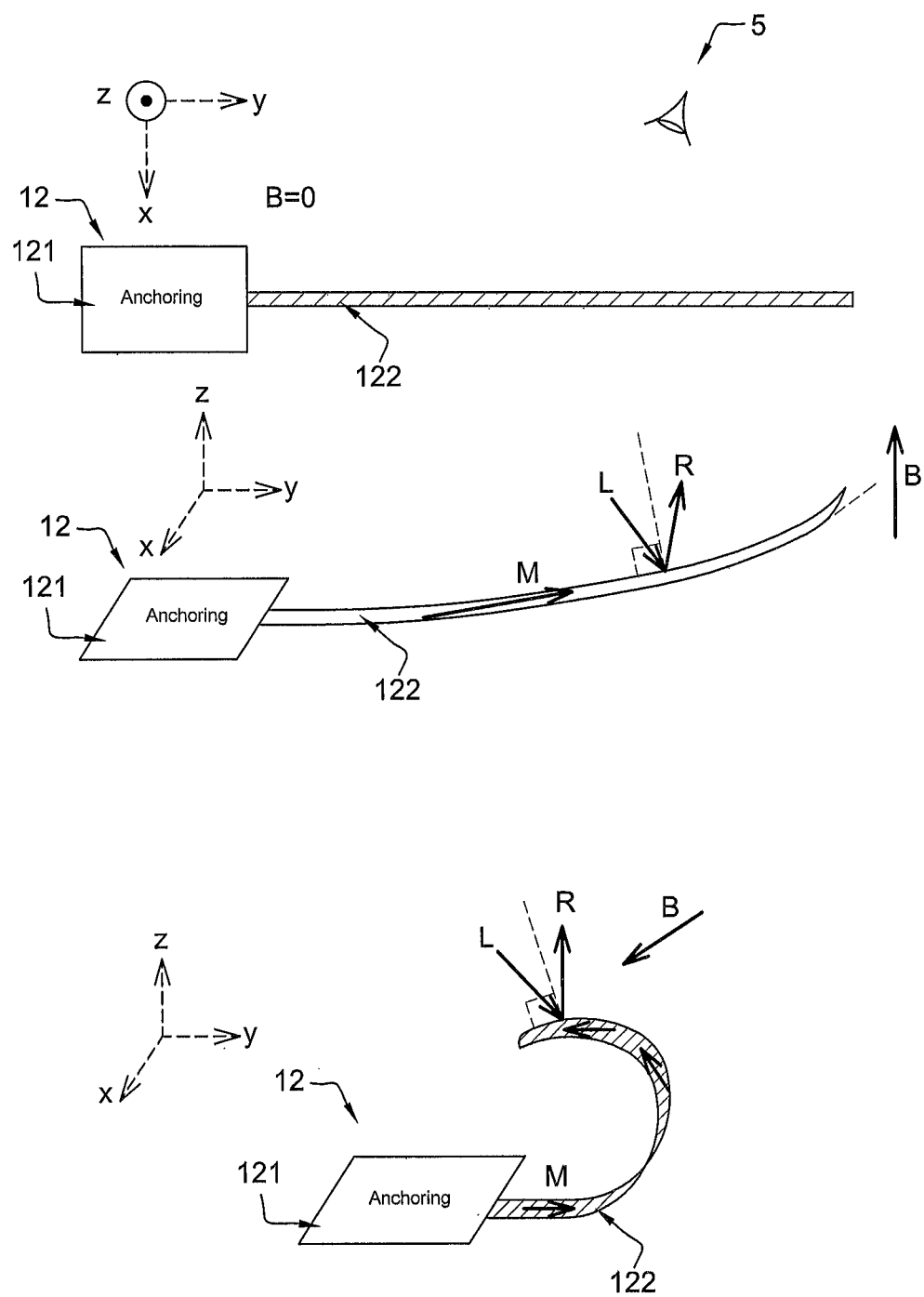

FIGS. 15A, 15B and 15C illustrate in a schematic manner examples of behaviour of moving elements 12 of different configurations to an external magnetic field B (zero and non-zero), as well as the incident light beam L from an external light source (not visible) and reflected R by the moving element (observable by a receiver 5). Depending on the geometries, and the external magnetic field B, the bending of the moving part(s) 122 of the moving elements 12 is more or less important. FIGS. 15A and 15B illustrate an example of moving element 12 having a moving part 122 comprising two branches. FIG. 15C illustrates an example of moving element 12, with one branch constituting the very flexible moving part 122. During a complete bending caused by the magnetic field B, it is the reverse side of the moving part 122, turned over, which becomes the reflecting surface. This underneath may have a surface of different colour, largely increasing the variation in the optical properties of the magneto-optic surface on which would be arranged such moving elements 12.

Figure 16A:
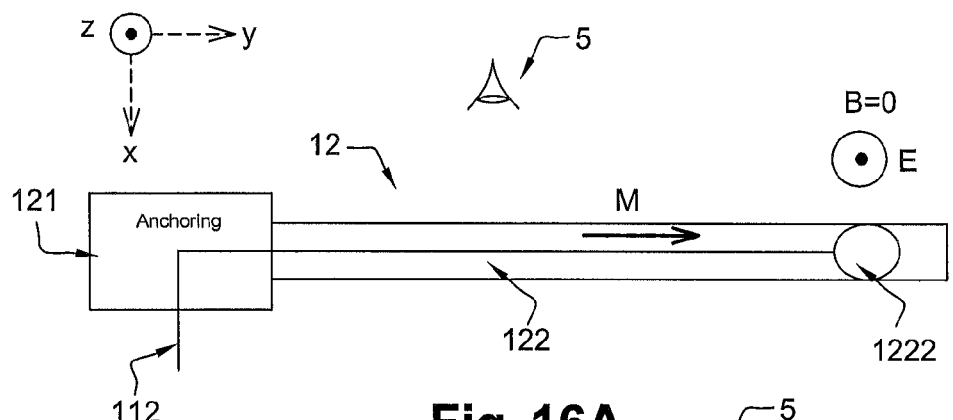
FIGS. 16A to 16C are schematic views of a same moving element of a magneto-optic surface according to an embodiment of the invention, each of FIGS. 16A to 16C being a view of the moving element subjected to a zero external field or subjected to a non-zero external field.
Figure 16B:
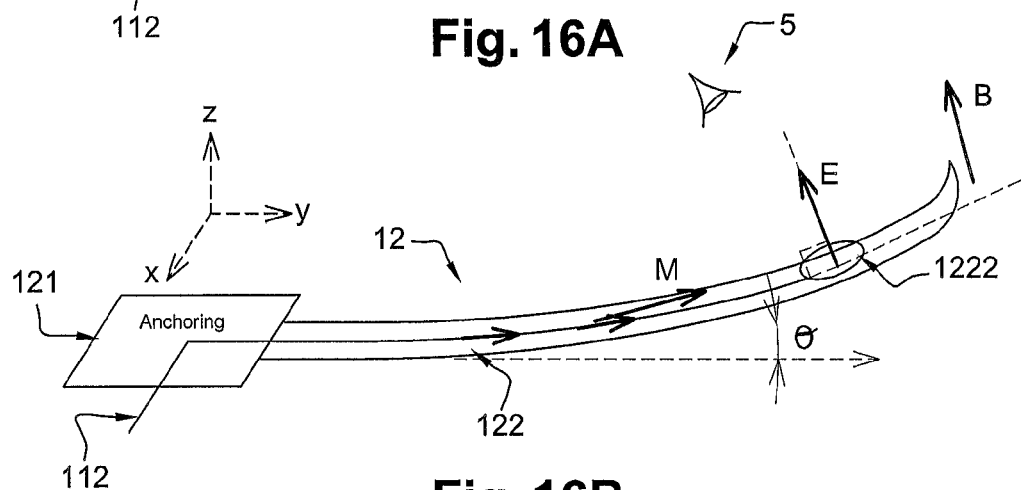
Figure 16C:
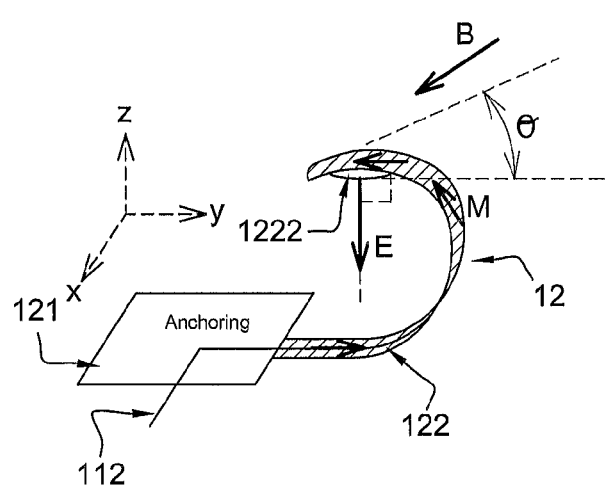

FIGS. 16A to 16C illustrate an example of embodiment of a moving element 12 comprising a light emitting device 1222 emitting an emitted light beam E. The moving element comprises an anchoring point 121 to a support, a moving part 122 made of magnetic material 1221. The emitting device 1222 is connected to an electrical power source of the support (not visible) by a connection element 112 passing for example through the anchoring point 121 which unifies the moving part and support. The moving element could also be formed entirely of an electrically conductive material which would avoid the presence of a connection element of wire type. The direction of the light emitted depends on the magnetic field applied.

Figure 17A:
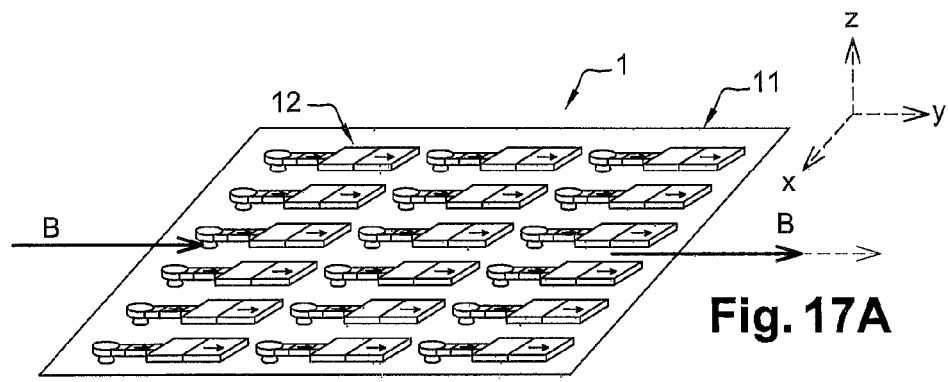
FIGS. 17A and 17B are schematic views of a magneto-optic surface according to an embodiment of the invention and FIGS. 17C to 17E schematic views of variants of embodiment of a moving element of a magneto-optic surface.
Figure 17B:
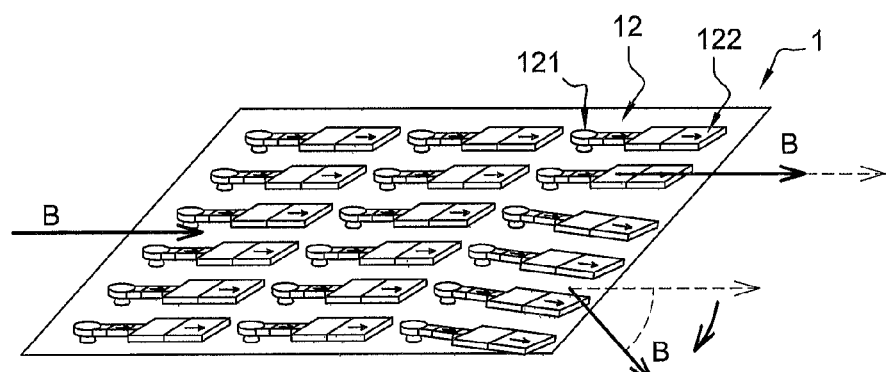
Figures 17C, 17D, 17E:
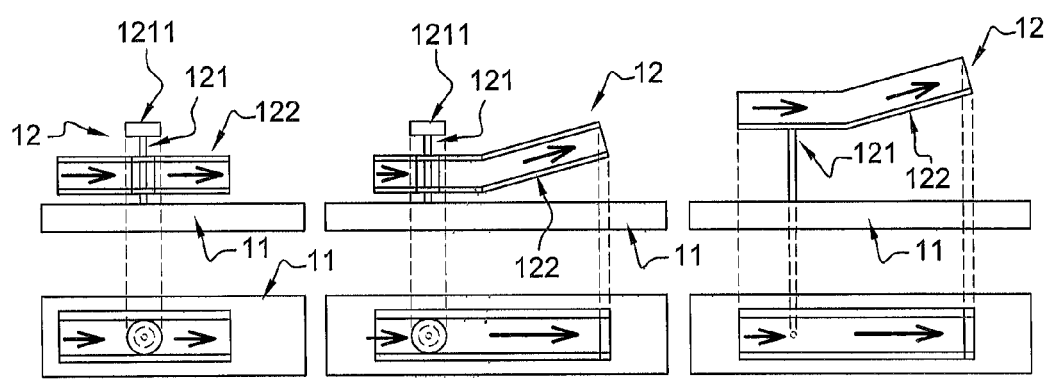

FIGS. 17A to 17E illustrate an example of embodiment of magneto-optic surface comprising moving elements 12 of which the anchoring point 121 to the support 11 is a fixed axis such that the moving element 12 is rotatable around the fixed axis 121 under the effect of an external magnetic field B. These moving elements 12 are capable of rotating in the plane of the support 11. Such a characteristic favours a mapping of the components of the magnetic field parallel to the magneto-optic surface 1 as illustrated between FIGS. 17A and 17B. FIG. 17C illustrates a moving element 12 rotatable around a fixed axis of anchoring to the support 121, the moving element 12 being symmetrical with respect to the fixed axis 121. FIG. 17D illustrates the case of a moving element 12 rotatable around a fixed axis of anchoring to the support 121, the moving element 12 being dissymmetrical with respect to the fixed axis 121. In these two cases (FIGS. 17C and 17D), the moving element 12 is maintained to the fixed axis by a hole formed in the moving element in which passes the axis 121 and a cap 1211 maintains the moving element 12 to the fixed axis 121. In this example of embodiment, the axis 121 is not free in rotation: there is torsion in the plane of the support. Generally speaking, the moving elements may be configured to be deformable in torsion and in flexion or in rotation and in flexion.

The applications of a magneto-optic surface according to one of the previously described embodiments are multiple.

It may constitute a "magneto-optic" transducer making it possible:
to obtain an information on a magnetic field thanks to the optic;
a detection of magnetic field;
a mapping of magnetic field; or
a quantitative measurement of the magnetic field.

It can also make it possible to realise a display of information thanks to the application of a magnetic field making it possible to control the behaviour of the reflected rays (secular or diffuse reflection) transmitted, or emitted by the application of the magnetic field. The directions of reflection, transmission, or emission of the incident optical beam being modified by the application of the magnetic field. Such a surface may be used to map a magnetic field in a zone. A magneto-optic surface is arranged in the zone, in which is located the magnetic field to be mapped, the surface is illuminated by an external light source (natural or artificial), and a receiver observes the image of the surface. Under the effect of the magnetic field, the moving elements are going to move and the amplitude of the local deflections of the light from the surface, due to the movement of the moving elements, is an image of the spatial distribution of the magnetic field.

A magneto-optic surface may for example be used for the detection of electrical conductivity non-homogeneities, for example fractures, in electrically conducting materials, highlighted by visualising non-homogeneities of magnetic fields created by currents; or for detecting current leaks, by the magnetic fields that they generate; or for detecting the structure in domains of a magnetic material creating the appearance of inhomogeneous magnetic fields.

An assembly of magneto-optic surfaces forming a volume (for example a polyhedron: tetrahedron, cube, etc.) can enable the mapping of a three-dimensional magnetic field.

An assembly of two magneto-optic surfaces each comprising a transparent support, covered with elements and pressed against each other by the faces not covered with moving elements, or spaced apart by a transparent spacer, can enable the mapping of magnetic fields at different altitudes along an axis perpendicular to the surfaces. In view of the same application, several surfaces may also be stacked one on top of the other and maintained with sufficient space leaving the moving elements to function, each at their altitude.

Figure 18:
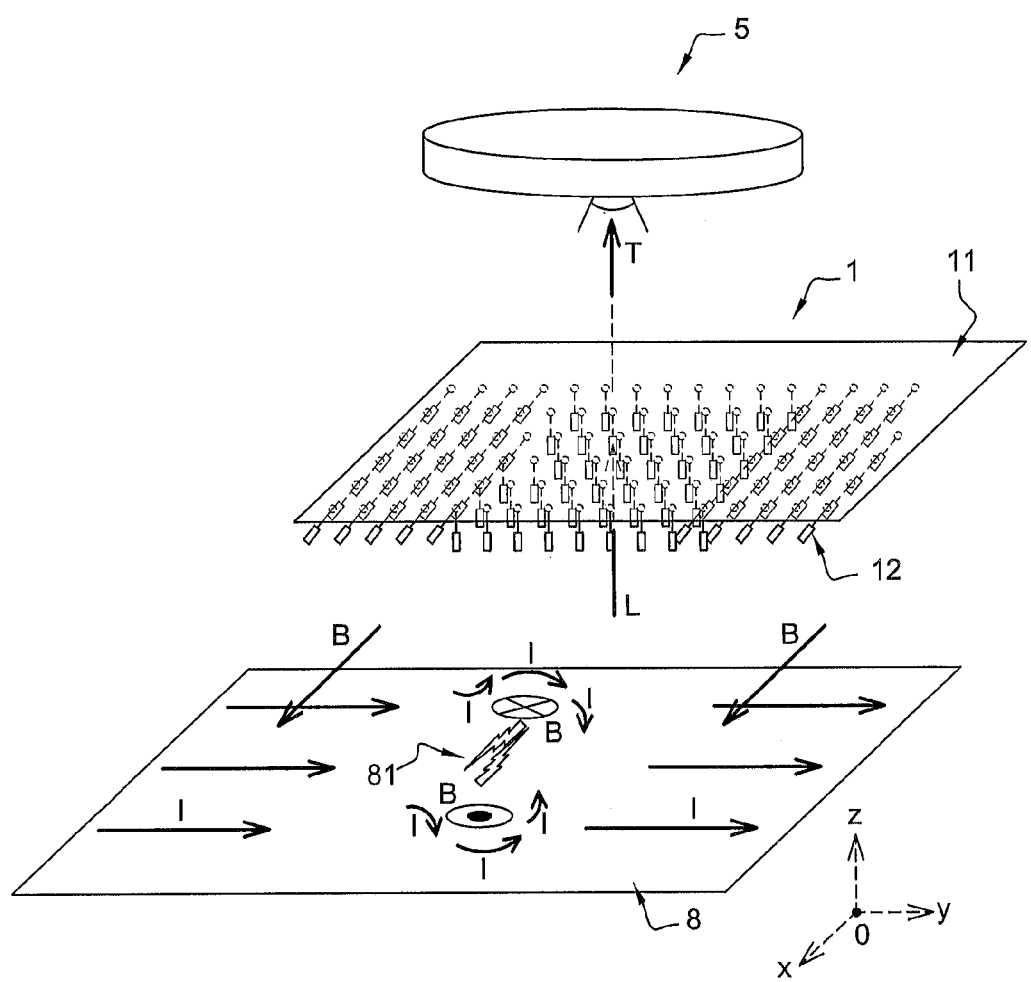
FIG. 18 is a diagram of a metal plate and a magneto-optic surface according to an embodiment of the invention.

FIG. 18 illustrates an example of application of a magneto-optic surface 1 for the detection of fractures in a metal plate 8. This surface 1 comprises a support 11 transparent to the light emitted by an external light source (not visible in figure), emitting the incident light beam L which passes through the surface 1, reflects on the metal plate 8, again passes through the surface 1 to be detected by the receiver 5 for studying the modification of its properties. The surface 1 is observed by a receiver 5, here a microscope that receives the transmitted light beam T. The moving elements 12 hang under the magneto-optic surface 1 opposite a metal plate 8. The fracture detection could also take place by observing the modifications of the reflection properties of the surface 1 (in this case, the moving elements 12 would be above the surface 1). The benefit of the study in transmission is that the moving elements 12 are as close as possible to the magnetic fields to be detected which improves the efficiency of the fracture detection and that they are more sensitive to the field, as seen in reference to FIG. 6B. To detect the presence of a fracture 81 in a metal plate 8, an electric current I is injected horizontally into the plate 8 (i.e. along the plane 0xy). If the plate 8 is arranged horizontally (i.e. along the plane 0xy), the magnetic field B created by I above the plate 8 is horizontal. On the other hand, a fracture 81 in the plate 8 creates a deviation of the current I, which generates a vertical field B, pointing upwards or downwards around the fracture 81. This vertical component of B is detected by the magneto-optic surface 1. In fact, the moving elements 12 hang vertically by gravity when B is zero or in a vertical field B (in this example of embodiment), and are raised to the horizontal in a horizontal field B. The presence of a fracture 81 thus leads to a modification of the image of the surface 1 observed in transmission by the microscope 5. Such a fracture detection method is particularly beneficial in the case of the detection of micro-fractures (or nano-fractures) in a metal plate undetectable to the naked eye. In a microscope, the moving elements 12 may be individually discernible if they are of micrometric dimensions. If they are nanometric, they will modify the contrast of the surface observed depending on their orientation. In all cases, depending on the receiver used, the modifications of the magnetic field are optically observable.

A magneto-optic surface in which the moving elements are all of same shape and of same dimension, may form a diffraction network of light emitted by an external light source when the step between the moving elements and their positioning makes it possible to diffract the light emitted by the light source. The intensity of the different tasks of diffraction may then be modified by application of a magnetic field.

The invention is not limited to the embodiments described previously with reference to the figures and variants could be envisaged without going beyond the scope of the invention.

The invention claimed is:

1. A magneto-optic assembly comprising:
   a support;
   at least two moving elements;
   each of said moving elements comprising:
      at least one anchoring point to the support, and
      at least one moving part movable with respect to the support, said moving part comprising at least one magnetic part;
   the support and said moving elements being laid out in such a way that under the effect of an external magnetic field, at least one of said moving elements moves with respect to the support such that the optical properties of the magneto-optic assembly are modified.

2. The magneto-optic assembly according to claim 1, wherein the support is transparent to the light emitted by an external light source and wherein the optical properties of the modified magneto-optic assembly are properties in transmission of said light.

3. The magneto-optic assembly according to claim 1, wherein the support is opaque to the light emitted by an external light source and wherein the optical properties of the modified magneto-optic assembly are properties in reflection of said light.

4. The magneto-optic assembly according to claim 1, wherein the moving part that is configured to move with respect to the support of each of said moving elements comprises a light emission device.

5. The magneto-optic assembly according to claim 4, wherein the support comprises an electrical power source and the light emission device of each of said moving elements is connected to the electrical power source by a connection element.

6. The magneto-optic assembly according to claim 1, wherein the moving part of each of said moving elements comprises a flexible part.

7. The magneto-optic assembly according to claim 1, wherein the moving part of each of said moving elements comprises a plurality of flexible parts connected to each other by less flexible parts.

8. The magneto-optic assembly according to claim 1, wherein the moving part of each of said moving elements comprises a reflecting part.

9. The magneto-optic assembly according to claim 1, wherein the anchoring point to the support is a fixed axis and wherein the moving element is rotatable around said fixed axis under the effect of the external magnetic field.

10. The magneto-optic assembly according to claim 1, wherein the moving elements are laid out such that they move along a same vector under the effect of a homogeneous external magnetic field.

11. The magneto-optic assembly according to claim 1, comprising:
   a first sub-assembly comprising at least two moving elements, the moving elements of the first sub-assembly moving along a same first vector under the effect of a homogeneous external magnetic field;
   a second sub-assembly comprising at least two moving elements, the moving elements of the second sub-assembly moving along a same second vector under the effect of a homogeneous external magnetic field.

12. A method of manufacturing a magneto-optic assembly according to claim 1, comprising:
   depositing on the support a layer of sacrificial material;
   forming a network of holes in the sacrificial material, the holes having a desired shape of the moving elements;
   depositing materials constituting said moving elements, said materials being deposited on the whole of the support;
   removing the sacrificial material, so that only the moving elements remain on the support; and
   releasing the moving parts from the support while conserving an anchoring point to the support.

13. A method of mapping a magnetic field, said magnetic field being in a zone, the method comprising:
   arranging a magneto-optic assembly according to claim 1 in said zone;
   observing an image of the magneto-optic assembly, an amplitude of local deflections of light from said magneto-optic assembly being an image of a spatial distribution of the magnetic field, said magneto-optic assembly being illuminated by a light source.

14. A method of detecting electrical conductivity inhomogeneity in an electrically conducting object, the method comprising:
   injecting a current into the electrically conducting object;
   observing a magneto-optic assembly according to claim 1, said magneto-optic assembly being arranged above said object and said magneto-optic assembly being illuminated by a light source, said observing being carried out by a receiver;
   wherein an inhomogeneity in a zone of the object is detected by a modification of the optical properties of the magneto-optic assembly at the level of the zone of the object under the action of the modification of the magnetic field brought about by the deviation of the current by the inhomogeneity.

15. A diffraction network comprising a magneto-optic assembly according to claim 1, wherein the moving elements have the same shape and the same dimensions and are laid out in such a way as to diffract light emitted by an external light source.

* * * * *